US008912452B2

(12) United States Patent
Hardin

(10) Patent No.: US 8,912,452 B2
(45) Date of Patent: Dec. 16, 2014

(54) Z-DIRECTED PRINTED CIRCUIT BOARD COMPONENTS HAVING DIFFERENT DIELECTRIC REGIONS

(75) Inventor: Keith Bryan Hardin, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 13/433,349

(22) Filed: Mar. 29, 2012

(65) Prior Publication Data

US 2013/0256020 A1 Oct. 3, 2013

(51) Int. Cl.
*H05K 1/16* (2006.01)
(52) U.S. Cl.
USPC .............................. 174/260; 174/262; 29/837
(58) Field of Classification Search
USPC .................... 174/260, 262–266; 29/837–839; 361/761–764
See application file for complete search history.

(56) References Cited

U.S. PATENT DOCUMENTS

| 2,005,582 | A | 3/1934 | Given |
| 2,188,667 | A | 1/1940 | Stoekle et al. |
| 3,142,783 | A | 7/1964 | Warren |
| 3,148,356 | A | 9/1964 | Hedden, Jr. |
| 3,219,886 | A | 11/1965 | Katzin et al. |
| 3,262,033 | A | 7/1966 | Culbertson |
| 3,377,611 | A | 4/1968 | Pawl et al. |
| 3,545,079 | A | 12/1970 | Kossar |
| 3,652,971 | A | 3/1972 | Bugg |
| 3,666,160 | A | 5/1972 | Gwyn, Jr. |
| 3,691,326 | A | 9/1972 | Grossman et al. |
| 3,798,394 | A | 3/1974 | Stokes |
| 3,996,440 | A | 12/1976 | Niconienko |
| 4,109,295 | A | 8/1978 | Rostek et al. |
| 4,109,296 | A | 8/1978 | Rostek et al. |
| 4,147,579 | A | 4/1979 | Schade |
| 4,199,209 | A | 4/1980 | Cherian et al. |
| 4,381,134 | A | 4/1983 | Anselmo et al. |
| 4,446,505 | A | 5/1984 | Long et al. |
| 4,543,715 | A | 10/1985 | Iadarola et al. |

(Continued)

FOREIGN PATENT DOCUMENTS

| EP | 202822 A2 | 11/1986 |
| GB | 1524388 A | 9/1978 |

(Continued)

OTHER PUBLICATIONS

Prosecution history of copending U.S. Appl. No. 13/349,822 including Non-Final Office Action dated Jul. 18, 2013.

(Continued)

*Primary Examiner* — Jeremy C Norris
(74) *Attorney, Agent, or Firm* — Justin M Tromp

(57) ABSTRACT

A Z-directed component for mounting in a mounting hole in a printed circuit board according to one example embodiment includes a body having a top surface, a bottom surface and a side surface. The body has a cross-sectional shape that is insertable into the mounting hole in the printed circuit board. A first portion of the body is composed of a first dielectric material having a first dielectric constant and a second portion of the body is composed of a second dielectric material having a second dielectric constant that is higher than the first dielectric constant. A conductive channel extends through a portion of the body forming a signal path.

13 Claims, 22 Drawing Sheets

(56) References Cited

U.S. PATENT DOCUMENTS

| | | |
|---|---|---|
| 4,561,486 A | 12/1985 | Maeda et al. |
| 4,642,588 A | 2/1987 | Kameya |
| 4,654,472 A | 3/1987 | Goldfarb |
| 4,654,749 A | 3/1987 | Kanai |
| 4,675,625 A | 6/1987 | Johnston |
| 4,700,155 A | 10/1987 | Sakamoto et al. |
| 4,711,015 A | 12/1987 | Tega et al. |
| 4,735,753 A | 4/1988 | Ackerman |
| 4,775,326 A | 10/1988 | Lenaerts et al. |
| 4,789,346 A | 12/1988 | Frantz |
| 4,850,892 A | 7/1989 | Clayton et al. |
| 4,913,863 A | 4/1990 | Burrafato |
| 5,010,945 A | 4/1991 | Burke |
| 5,147,985 A | 9/1992 | DuBrucq |
| 5,166,096 A | 11/1992 | Cote et al. |
| 5,344,343 A | 9/1994 | Seidler |
| 5,406,444 A | 4/1995 | Selfried et al. |
| 5,603,847 A | 2/1997 | Howard et al. |
| 5,650,759 A | 7/1997 | Hittman et al. |
| 5,669,789 A | 9/1997 | Law |
| 5,708,569 A | 1/1998 | Howard et al. |
| 5,760,336 A | 6/1998 | Wang |
| 5,783,026 A | 7/1998 | Natarajan et al. |
| 5,851,865 A | 12/1998 | Kolke |
| 5,858,145 A | 1/1999 | Sreeram et al. |
| 5,870,921 A | 2/1999 | Piccinin et al. |
| 5,952,723 A | 9/1999 | Takeyasu et al. |
| 6,045,615 A | 4/2000 | Buechele et al. |
| 6,054,649 A | 4/2000 | Uchida et al. |
| 6,068,782 A | 5/2000 | Brandt et al. |
| 6,153,290 A | 11/2000 | Sunahara |
| 6,165,864 A | 12/2000 | Shen et al. |
| 6,319,018 B1 | 11/2001 | Daoud |
| 6,329,715 B1 | 12/2001 | Hayashi |
| 6,388,208 B1 | 5/2002 | Kiani et al. |
| 6,581,276 B2 | 6/2003 | Chung |
| 6,593,535 B2 | 7/2003 | Gailus |
| 6,735,855 B2 | 5/2004 | Akram et al. |
| 6,747,217 B1 | 6/2004 | Jochym et al. |
| 6,754,551 B1 | 6/2004 | Zohar et al. |
| 6,870,252 B2 | 3/2005 | Novak et al. |
| 6,920,673 B2 | 7/2005 | Allen et al. |
| 6,948,943 B2 | 9/2005 | Li |
| 6,950,066 B2 | 9/2005 | Hendler et al. |
| 6,983,535 B2 | 1/2006 | Crockett et al. |
| 7,101,730 B2 | 9/2006 | Bolken et al. |
| 7,238,892 B2 | 7/2007 | Bois et al. |
| 7,416,985 B2 | 8/2008 | Yamamoto et al. |
| 7,458,151 B2 | 12/2008 | Onodera et al. |
| 7,486,498 B2 | 2/2009 | Welsch et al. |
| 7,509,856 B1 | 3/2009 | Winkens et al. |
| 7,525,814 B2 | 4/2009 | Yuri et al. |
| 7,599,191 B2 | 10/2009 | Shinaberger et al. |
| 7,663,064 B2 | 2/2010 | Dutta et al. |
| 7,820,479 B2 | 10/2010 | Sakaguchi |
| 7,843,056 B2 | 11/2010 | Smeys et al. |
| 7,888,599 B2 | 2/2011 | Kim et al. |
| 7,891,980 B2 | 2/2011 | Frasco |
| 7,969,745 B2 | 6/2011 | Hsu et al. |
| 8,000,763 B2 | 8/2011 | Mazza et al. |
| 8,035,951 B2 | 10/2011 | Wu et al. |
| 8,094,429 B2 | 1/2012 | Hsu et al. |
| 8,115,113 B2 | 2/2012 | Tanaka |
| 2001/0012036 A1 | 8/2001 | Giere et al. |
| 2002/0086188 A1 | 7/2002 | Halsey et al. |
| 2002/0117330 A1 | 8/2002 | Eldridge et al. |
| 2003/0081370 A1 | 5/2003 | Haskell et al. |
| 2003/0101585 A1 | 6/2003 | Pearson et al. |
| 2004/0121266 A1 | 6/2004 | Lee et al. |
| 2004/0224558 A1 | 11/2004 | Wan et al. |
| 2004/0242082 A1 | 12/2004 | Tsuchiya |
| 2005/0128680 A1 | 6/2005 | Shin et al. |
| 2005/0156319 A1 | 7/2005 | Oggioni et al. |
| 2005/0286238 A1 | 12/2005 | Joy |
| 2006/0009038 A1 | 1/2006 | Cohen et al. |
| 2006/0054352 A1 | 3/2006 | Ryu et al. |
| 2006/0137907 A1 | 6/2006 | Chheda et al. |
| 2006/0145800 A1 | 7/2006 | Dadafshar et al. |
| 2006/0215380 A1 | 9/2006 | Lu et al. |
| 2006/0243581 A1 | 11/2006 | Nishimoto et al. |
| 2006/0266549 A1 | 11/2006 | Lin et al. |
| 2006/0278072 A1 | 12/2006 | Kent et al. |
| 2006/0286696 A1 | 12/2006 | Peiffer et al. |
| 2007/0051594 A1 | 3/2007 | Schwarz et al. |
| 2007/0085125 A1 | 4/2007 | Inoue et al. |
| 2007/0099513 A1 | 5/2007 | Savage et al. |
| 2007/0124930 A1 | 6/2007 | Cheng et al. |
| 2007/0138646 A1 | 6/2007 | Heston et al. |
| 2007/0257761 A1 | 11/2007 | Mano et al. |
| 2008/0013250 A1 | 1/2008 | Aoki |
| 2008/0047137 A1 | 2/2008 | Asahi et al. |
| 2008/0060837 A1* | 3/2008 | Matsui ................... 174/261 |
| 2008/0093336 A1 | 4/2008 | Lee et al. |
| 2008/0112109 A1 | 5/2008 | Muto et al. |
| 2008/0158770 A1 | 7/2008 | Lee et al. |
| 2008/0158851 A1 | 7/2008 | Cochrane |
| 2008/0169125 A1 | 7/2008 | Hsu et al. |
| 2008/0202799 A1 | 8/2008 | Graydon et al. |
| 2008/0223603 A1 | 9/2008 | Kim et al. |
| 2008/0236876 A1 | 10/2008 | Kodama et al. |
| 2008/0315024 A1 | 12/2008 | Gallagher |
| 2008/0318410 A1 | 12/2008 | Hwang |
| 2009/0046441 A1 | 2/2009 | Funaya et al. |
| 2009/0097218 A1 | 4/2009 | Miyamoto |
| 2009/0114421 A1 | 5/2009 | Swift et al. |
| 2009/0154872 A1 | 6/2009 | Sherrer et al. |
| 2009/0175012 A1 | 7/2009 | Frasco |
| 2009/0219667 A1 | 9/2009 | Eriksson |
| 2010/0026440 A1 | 2/2010 | Lim et al. |
| 2010/0059266 A1 | 3/2010 | Yoo et al. |
| 2010/0124035 A1 | 5/2010 | Bandholz et al. |
| 2010/0208440 A1 | 8/2010 | Peiffer et al. |
| 2010/0230806 A1 | 9/2010 | Huang et al. |
| 2010/0237495 A1 | 9/2010 | Pagaila et al. |
| 2010/0326843 A1 | 12/2010 | Zhang et al. |
| 2011/0017502 A1 | 1/2011 | Hardin et al. |
| 2011/0017503 A1 | 1/2011 | Hardin et al. |
| 2011/0017504 A1 | 1/2011 | Hardin et al. |
| 2011/0017505 A1 | 1/2011 | Hardin et al. |
| 2011/0017507 A1 | 1/2011 | Hardin et al. |
| 2011/0017581 A1 | 1/2011 | Hardin et al. |
| 2011/0019374 A1 | 1/2011 | Hardin et al. |
| 2011/0019375 A1 | 1/2011 | Hardin et al. |
| 2011/0019376 A1 | 1/2011 | Hardin et al. |
| 2011/0037155 A1 | 2/2011 | Pagaila |

FOREIGN PATENT DOCUMENTS

| | | |
|---|---|---|
| JP | 2002-316084 A | 10/2002 |
| WO | 8001146 A1 | 6/1980 |
| WO | 8301923 A1 | 6/1983 |
| WO | 2006121818 A2 | 11/2006 |

OTHER PUBLICATIONS

Prosecution history of copending U.S. Appl. No. 12/508,131 including Non-Final Office Action dated Jul. 18, 2013.

International Search Report and Written Opinion of the International Searching Authority for PCT Application No. PCT/US13/34298 dated Jul. 5, 2013.

International Search Report and Written Opinion of the International Searching Authority for PCT Application No. PCT/US13/34289 dated Jul. 8, 2013.

International Search Report and Written Opinion of the International Searching Authority for PCT Application No. PCT/US13/34285 dated Jun. 28, 2013.

International Search Report and Written Opinion of the International Searching Authority for PCT Application No. PCT/US13/34281 dated Jul. 8, 2013.

International Search Report and Written Opinion of the International Searching Authority for PCT Application No. PCT/US12/52256 dated Nov. 16, 2012.

(56) References Cited

OTHER PUBLICATIONS

International Search Report and Written Opinion of the International Searching Authority for PCT Application No. PCT/US12/52258 dated Nov. 16, 2012.
International Search Report and Written Opinion of the International Searching Authority for PCT Application No. PCT/US12/52262 dated Jan. 10, 2013.
International Search Report and Written Opinion of the International Searching Authority for PCT Application No. PCT/US12/56840 dated Jan. 11, 2013.
International Search Report and Written Opinion of the International Searching Authority for PCT Application No. PCT/US12/61251 dated Jan. 25, 2013.
Prosecution history of copending U.S. Appl. No. 12/508,204 including Non-Final Office Action dated Jan. 16, 2013.
Prosecution history of copending U.S. Appl. No. 12/508,131 including Non-Final Office Action dated Sep. 11, 2012.
Prosecution history of copending U.S. Appl. No. 12/508,215 including Non-Final Office Action dated Oct. 26, 2012.
Copending U.S. Appl. No. 13/433,340, filed Mar. 29, 2012.
U.S. Appl. No. 13/528,097, filed Jun. 20, 2012.
U.S. Appl. No. 13/528,129, filed Jun. 20, 2012.
Prosecution history of copending U.S. Appl. No. 12/508,236 including Notice of Allowance dated Jun. 18, 2012.
Prosecution history of copending U.S. Appl. No. 12/508,215 including Final Office Action dated Aug. 1, 2012.
Prosecution history of copending U.S. Appl. No. 12/508,204 including Non-Final Office Action dated Aug. 2, 2012.
Prosecution history of copending U.S. Appl. No. 12/508,248 including Notice of Allowance dated Aug. 16, 2012.
Prosecution history of copending U.S. Appl. No. 12/508,188 including Final Office Action dated Jun. 20, 2012.
Prosecution history of copending U.S. Appl. No. 12/508,131 including Final Office Action dated Feb. 27, 2013.
Prosecution history of copending U.S. Appl. No. 12/508,188 including Non-Final Office Action dated May 7, 2013.
"IPC Standards—The Evolution of Embedded Components Standards"; IPC Review Mar./Apr. 2009; p. 14; vol. 2; IPC, Inc., Bannockburn, Illinois, USA (1 page).
2010 Spectrum Advanced Specialty Products Catalog; relevant pp. AC2-AC12; Spectrum Advanced Specialty Products; Fairview, Pennsylvania, USA (21 pages).
International Searching Authority, International Search Report and Written Opinion for PCT/US2011/022005, Mar. 18, 2011 (6 pages).
International Searching Authority, International Search Report and Written Opinion for PCT/US2011/022008, Mar. 29, 2011 (6 pages).
International Searching Authority, International Search Report and Written Opinion for PCT/US2011/022012, Apr. 11, 2011 (7 pages).
International Searching Authority, International Search Report and Written Opinion for PCT/US2011/022019, Mar. 23, 2011 (8 pages).
International Searching Authority, International Search Report and Written Opinion for PCT/US2011/022021, Mar. 28, 2011 (6 pages).
International Searching Authority, International Search Report and Written Opinion for PCT/US2011/022022, Mar. 28, 2011 (6 pages).
International Searching Authority, International Search Report and Written Opinion for PCT/US2011/022027, May 2, 2011 (7 pages).
International Searching Authority, International Search Report and Written Opinion for PCT/US2011/022028, Apr. 1, 2011 (9 pages).
International Searching Authority, International Search Report and Written Opinion for PCT/US2011/022036, Apr. 1, 2011 (6 pages).
Copending U.S. Appl. No. 13/222,418, filed Aug. 31, 2011.
Copending U.S. Appl. No. 13/222,276, filed Aug. 31, 2011.
Copending U.S. Appl. No. 13/222,748, filed Aug. 31, 2011.
Copending U.S. Appl. No. 13/250,812, filed Sep. 30, 2011.
Copending U.S. Appl. No. 13/284,084, filed Oct. 28, 2011.
Copending U.S. Appl. No. 13/433,349, filed Mar. 29, 2012.
Copending U.S. Appl. No. 13/433,355, filed Mar. 29, 2012.
Copending U.S. Appl. No. 13/433,364, filed Mar. 29, 2012.
Copending U.S. Appl. No. 13/433,369, filed Mar. 29, 2012.
Copending U.S. Appl. No. 13/349,822, filed Jan. 13, 2012.
Copending U.S. Appl. No. 13/448,460, filed Apr. 17, 2012.
Prosecution history of copending U.S. Appl. No. 12/508,131 including non-final Office Action dated Sep. 30, 2011 and final Office Action dated Mar. 20, 2012.
Prosecution history of copending U.S. Appl. No. 12/508,145 including *Ex Parte Quayle* Action dated Feb. 2, 2012 and Notice of Allowance dated Feb. 17, 2012.
Prosecution history of copending U.S. Appl. No. 12/508,158 including non-final Office Action dated Oct. 19, 2011 and Notice of Allowance dated Feb. 29, 2012.
Prosecution history of copending U.S. Appl. No. 12/508,188 including non-final Office Action dated Feb. 22, 2012.
Prosecution history of copending U.S. Appl. No. 12/508,199 including Notice of Allowance dated Apr. 3, 2012.
Prosecution history of copending U.S. Appl. No. 12/508,204 including non-final Office Action dated Oct. 7, 2011 and final Office Action dated Mar. 13, 2012.
Prosecution history of copending U.S. Appl. No. 12/508,215 including non-final Office Action dated Mar. 30, 2012.
Prosecution history of copending U.S. Appl. No. 12/508,236 including non-final Office Action dated Mar. 1, 2012.
Prosecution history of copending U.S. Appl. No. 12/508,248 including non-final Office Action dated Sep. 30, 2011 and final Office Action dated Mar. 14, 2012.
International Search Report and Written Opinion of the International Searching Authority for PCT Application No. PCT/US13/46466 dated Oct. 16, 2013.
International Search Report and Written Opinion of the International Searching Authority for PCT Application No. PCT/US13/46467 dated Nov. 14, 2013.
Prosecution history of copending U.S. Appl. No. 13/448,460 including Non-Final Office Action dated Sep. 13, 2013.
Prosecution history of copending U.S. Appl. No. 13/717,966 including Non-Final Office Action dated Sep. 11, 2013.
Prosecution history of copending U.S. Appl. No. 13/433,340 including Non-Final Office Action dated Oct. 9, 2013.
Prosecution history of copending U.S. Appl. No. 12/508,188 including Final Office Action dated Sep. 10, 2013.
Prosecution history of copending U.S. Appl. No. 13/433,355 including Non-Final Office Action dated Oct. 4, 2013.
Prosecution history of copending U.S. Appl. No. 13/433,364 including Non-Final Office Action dated Dec. 19, 2013.
Prosecution history of copending U.S. Appl. No. 13/349,822 including Non-Final Office Action dated Jan. 13, 2014.
Prosecution history of copending U.S. Appl. No. 12/508,188 including Notice of Allowance dated Jan. 14, 2014.
Prosecution history of copending U.S. Appl. No. 13/349,822 including Notice of Allowance dated May 23, 2014.
Prosecution history of copending U.S. Appl. No. 13/433,340 including Notice of Allowance dated Apr. 25, 2014.
Prosecution history of copending U.S. Appl. No. 13/433,355 including Notice of Allowance dated Apr. 25, 2014.
Prosecution history of copending U.S. Appl. No. 13/433,364 including Notice of Allowance dated May 21, 2014.
Prosecution history of copending U.S. Appl. No. 13/433,369 including Non-Final Office Action dated May 20, 2014.
U.S. Appl. No. 14/248,685, filed Apr. 9, 2014.

* cited by examiner

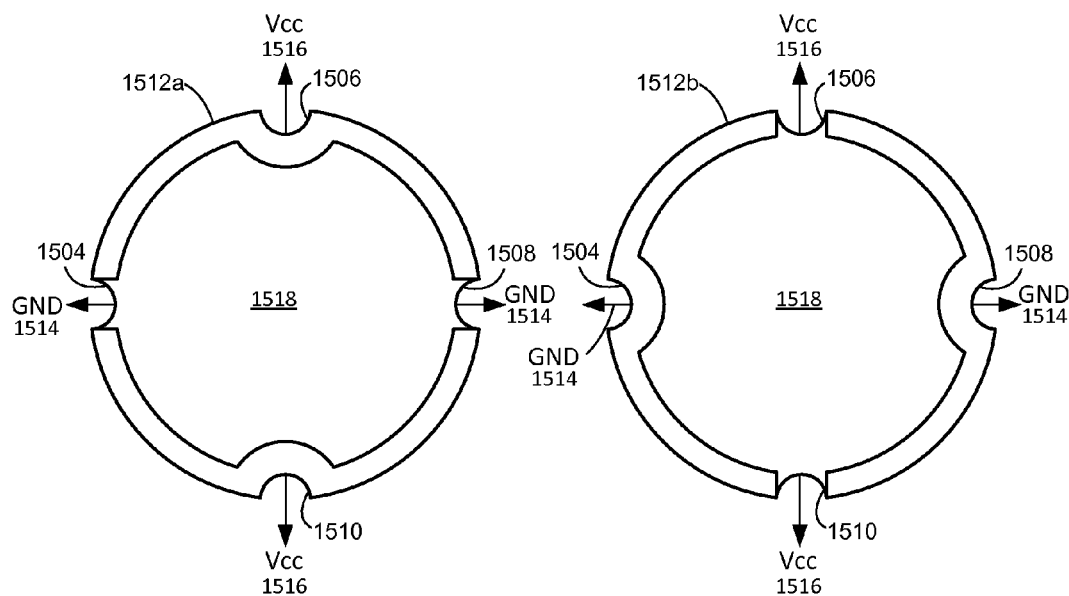
Figure 25A
Figure 25B
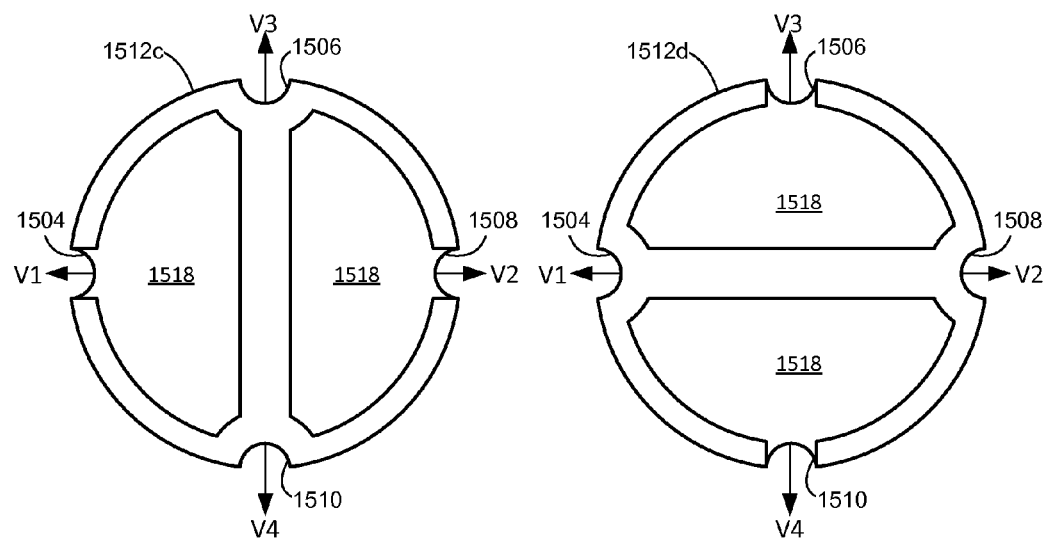
Figure 25C
Figure 25D

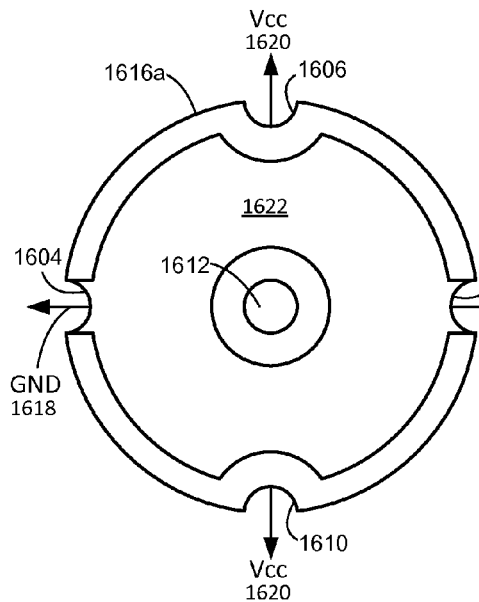
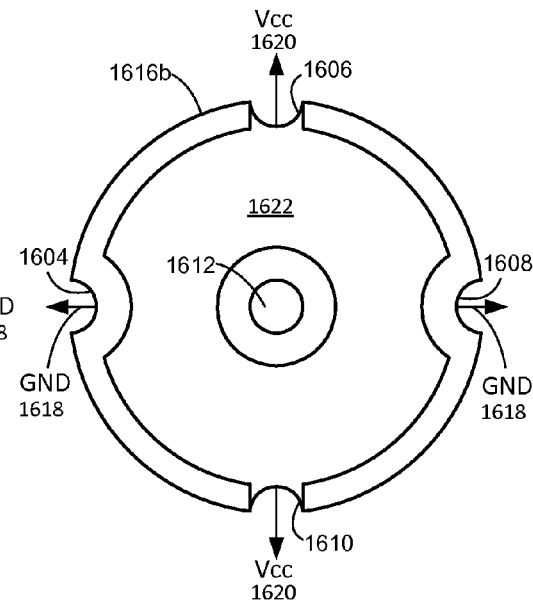
Figure 29A        Figure 29B
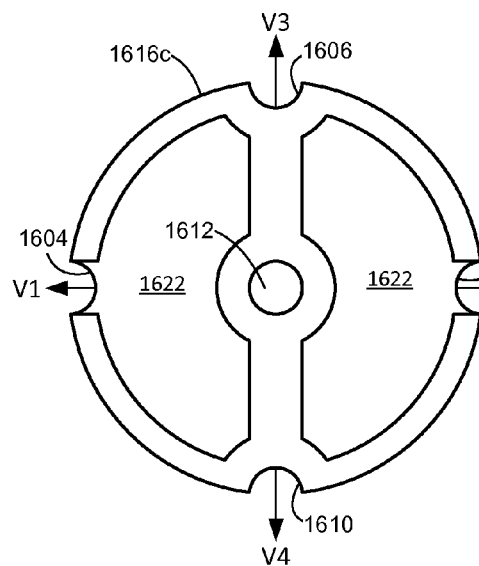
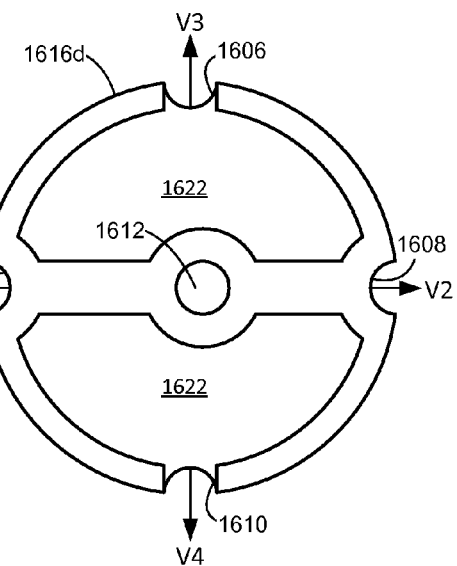
Figure 29C        Figure 29D

Z-DIRECTED PRINTED CIRCUIT BOARD COMPONENTS HAVING DIFFERENT DIELECTRIC REGIONS

CROSS REFERENCES TO RELATED APPLICATIONS

This patent application is related to the following United States patent applications, which are assigned to the assignee of the present application: Ser. No. 13/433,340, filed Mar. 29, 2012, entitled "Z-Directed Printed Circuit Board Components having Conductive Channels for Controlling Transmission Line Impedance," Ser. No. 13/433,355, filed Mar. 29, 2012, entitled "Z-Directed Printed Circuit Board Components having Conductive Channels for Reducing Radiated Emissions," Ser. No. 13/433,364, filed Mar. 29, 2012, entitled "Ball Grid Array Systems for Surface Mounting an Integrated Circuit using a Z-Directed Printed Circuit Board Component," and Ser. No. 13/433,369, filed Mar. 29, 2012, entitled "Systems for Surface Mounting an Integrated Circuit using a Z-Directed Printed Circuit Board Component."

BACKGROUND

1. Field of the Disclosure

The present invention relates generally to electronic components and more particularly to Z-directed electronic components for insertion into a printed circuit board.

2. Description of the Related Art

The following co-pending U.S. patent applications, which are assigned to the assignee of the present application, describe various "Z-directed" components that are intended to be embedded or inserted into a printed circuit board ("PCB"): Ser. No. 12/508,131 entitled "Z-Directed Components for Printed Circuit Boards," Ser. No. 12/508,145 entitled "Z-Directed Pass-Through Components for Printed Circuit Boards," Ser. No. 12/508,158 entitled "Z-Directed Capacitor Components for Printed Circuit Boards," Ser. No. 12/508,188 entitled "Z-Directed Delay Line Components for Printed Circuit Boards," Ser. No. 12/508,199 entitled "Z-Directed Filter Components for Printed Circuit Boards," Ser. No. 12/508,204 entitled "Z-Directed Ferrite Bead Components for Printed Circuit Boards," Ser. No. 12/508,215 entitled "Z-Directed Switch Components for Printed Circuit Boards," Ser. No. 12/508,236 entitled "Z-Directed Connector Components for Printed Circuit Boards," and Ser. No. 12/508,248 entitled "Z-Directed Variable Value Components for Printed Circuit Boards."

Printed Circuit Board (PCB) manufacturing primarily uses two types of components. The first type is a pin through-hole part that uses metallic leads that are soldered into a plated through-hole in the PCB. The second type is a surface mount part that sits on the surface of a PCB and is attached by soldering to pads on the surface. As densities of components for printed circuit boards have increased and higher frequencies of operation are used, some circuits' designs have become very difficult to achieve. The Z-directed components described in the foregoing patent applications are designed to improve the component densities and frequencies of operation. The Z-directed components occupy less space on the surface of a PCB and for high frequency circuits, e.g. clock rates greater than 1 GHz, allow for higher frequency of operation. The foregoing patent applications describe various types of Z-directed components including, but not limited to, capacitors, delay lines, transistors, switches, and connectors.

Transmission line impedance discontinuities are a problem in circuits utilizing a high frequency signal. These discontinuities may cause signal attenuation and other parasitic effects. Accordingly, a component that provides a substantially constant transmission line impedance is often desired. Another problem with high frequency circuits is the generation and receipt of electromagnetic interference (EMI). A significant source of EMI in a circuit is its loop area. A circuit having a greater loop area may be more prone to pick up an unwanted signal or radiate unwanted energy that may interfere with its operation or the operation of other circuits nearby. Accordingly, a component having a minimal loop area is often desired.

SUMMARY

A Z-directed component for mounting in a mounting hole in a printed circuit board according to one example embodiment includes a body having a top surface, a bottom surface and a side surface. The body has a cross-sectional shape that is insertable into the mounting hole in the printed circuit board. A first portion of the body is composed of a first dielectric material having a first dielectric constant and a second portion of the body is composed of a second dielectric material having a second dielectric constant that is higher than the first dielectric constant. A conductive channel extends through a portion of the body forming a signal path.

A printed circuit board according to one example embodiment includes a Z-directed component mounted in a mounting hole in the printed circuit board. The Z-directed component includes a body having a top surface, a bottom surface and a side surface. A first portion of the body is composed of a first dielectric material having a first dielectric constant and a second portion of the body is composed of a second dielectric material having a second dielectric constant that is higher than the first dielectric constant. A conductive channel extends through a portion of the body and is electrically connected to a signal path of the printed circuit board.

A Z-directed signal delay line component for mounting in a mounting hole in a printed circuit board according to one example embodiment includes a body having a top surface, a bottom surface and a side surface. The body has a cross-sectional shape that is insertable into the mounting hole in the printed circuit board. A first portion of the body is composed of a first dielectric material having a first dielectric constant and a second portion of the body is composed of a second dielectric material having a second dielectric constant that is higher than the first dielectric constant. A conductive channel forms a signal path through the body. The conductive channel passes through at least part of the first and second portions of the body. The second portion of the body imposes a delay on a signal when the signal passes through the conductive channel.

BRIEF DESCRIPTION OF THE DRAWINGS

The above-mentioned and other features and advantages of the various embodiments, and the manner of attaining them, will become more apparent and will be better understood by reference to the accompanying drawings.

FIGS. 25A-D are plan views of various example embodiments of support members for the Z-directed capacitor shown in FIGS. 22 and 23.

FIGS. 29A-D are plan views of various example embodiments of support members for the Z-directed capacitor shown in FIG. 26.

DETAILED DESCRIPTION

Figure 1:
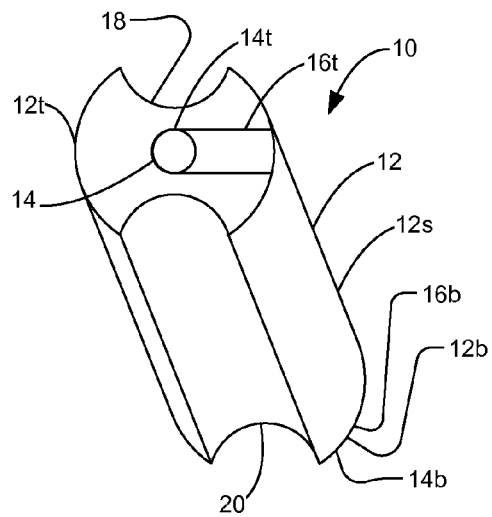
FIG. 1 is a perspective view of a Z-directed component according to one example embodiment.

The following description and drawings illustrate embodiments sufficiently to enable those skilled in the art to practice the present invention. It is to be understood that the disclosure is not limited to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the application encompasses the appended claims and all available equivalents. The following description is, therefore, not to be taken in a limited sense and the scope of the present invention is defined by the appended claims.

Also, it is to be understood that the phraseology and terminology used herein is for the purpose of description and should not be regarded as limiting. The use of "including,"

"comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Overview of Z-Directed Components

An X-Y-Z frame of reference is used herein. The X and Y axes describe the plane defined by the face of a printed circuit board. The Z-axis describes a direction perpendicular to the plane of the circuit board. The top surface of the PCB has a zero Z-value. A component with a negative Z-direction value indicates that the component is inserted into the top surface of the PCB. Such a component may be above (extend past), flush with, or recessed below either the top surface and/or the bottom surface of the PCB. A component having both a positive and negative Z-direction value indicates that the component is partially inserted into the surface of the PCB. The Z-directed components are intended to be inserted into a hole or recess in a printed circuit board. Depending on the shape and length of the component(s), more than one Z-directed component may be inserted into a single mounting hole in the PCB, such as being stacked together or positioned side by side. The hole may be a through-hole (a hole from the top surface through to the bottom surface), a blind hole (an opening or recess through either the top or bottom surface into an interior portion or internal layer of the PCB) or an internal cavity such that the Z-directed component is embedded within the PCB.

For a PCB having conductive traces on both external layers, one external layer is termed the top surface and the other the bottom surface. Where only one external layer has conductive traces, that external surface is referred to as the top surface. The Z-directed component is referred to as having a top surface, a bottom surface and a side surface. The references to top and bottom surfaces of the Z-directed component conform to the convention used to refer to the top and bottom surfaces of the PCB. The side surface of a Z-directed component extends between the top and bottom surfaces of the PCB and would be adjacent to the wall of the mounting hole in the PCB where the mounting hole is perpendicular to the face of the PCB. This use of top, bottom and side should not be taken as limiting how a Z-directed component may be mounted into a PCB. Although the components are described herein as being mounted in a Z-direction, this does not mean that such components are limited to being inserted into a PCB only along the Z-axis. Z-directed components may be mounted normal to the plane of the PCB from the top or bottom surfaces or both surfaces, mounted at an angle thereto or, depending on the thickness of the PCB and the dimensions of the Z-directed component, inserted into the edge of the PCB between the top and bottom surfaces of the PCB. Further, the Z-directed components may be inserted into the edge of the PCB even if the Z-directed component is wider than the PCB is tall as long as the Z-directed component is held in place.

The Z-directed components may be made from various combinations of materials commonly used in electronic components. The signal connection paths are made from conductors, which are materials that have high conductivity. Unless otherwise stated, reference to conductivity herein refers to electrical conductivity. Conducting materials include, but are not limited to, copper, gold, aluminum, silver, tin, lead and many others. The Z-directed components may have areas that need to be insulated from other areas by using insulator materials that have low conductivity like plastic, glass, FR4 (epoxy & fiberglass), air, mica, ceramic and others. Capacitors are typically made of two conducting plates separated by an insulator material that has a high permittivity (dielectric constant). Permittivity is a parameter that shows the ability to store electric fields in the materials like ceramic, mica, tantalum and others. A Z-directed component that is constructed as a resistor requires materials that have properties that are between a conductor and insulator having a finite amount of resistivity, which is the reciprocal of conductivity. Materials like carbon, doped semiconductor, nichrome, tin-oxide and others are used for their resistive properties. Inductors are typically made of coils of wires or conductors wrapped around a material with high permeability. Permeability is a parameter that shows the ability to store magnetic fields in the material which may include iron and alloys like nickel-zinc, manganese-zinc, nickel-iron and others. Transistors such as field effect transistors ("FETs") are electronic devices that are made from semiconductors that behave in a nonlinear fashion and are made from silicon, germanium, gallium arsenide and others.

Throughout the application there are references that discuss different materials, properties of materials or terminology interchangeably as currently used in the art of material science and electrical component design. Because of the flexibility in how a Z-directed component may be employed and the number of materials that may be used, it is also contemplated that Z-directed components may be constructed of materials that have not been discovered or created to date. The body of a Z-directed component will in general be comprised of an insulator material unless otherwise called out in the description for a particular design of a Z-directed component. This material may possess a desired permittivity, e.g., the body of a capacitor will typically be comprised of an insulator material having a relatively high dielectric constant.

PCBs using a Z-directed component may be constructed to have a single conductive layer or multiple conductive layers as is known. The PCB may have conductive traces on the top surface only, on the bottom surface only, or on both the top and bottom surfaces. In addition, one or more intermediate internal conductive trace layers may also be present in the PCB.

Connections between a Z-directed component and the traces in or on a PCB may be accomplished by soldering techniques, screening techniques, extruding techniques or plating techniques known in the art. Depending on the application, solder pastes and conductive adhesives may be used. In some configurations, compressive conductive members may be used to interconnect a Z-directed component to conductive traces found on the PCB.

The most general form of a Z-directed component comprises a body having a top surface, a bottom surface and a side surface, a cross-sectional shape that is insertable into a mounting hole of a given depth D within a PCB with a portion of the body comprising an insulator material. All of the embodiments described herein for Z-directed components are based on this general form.

Figure 2:
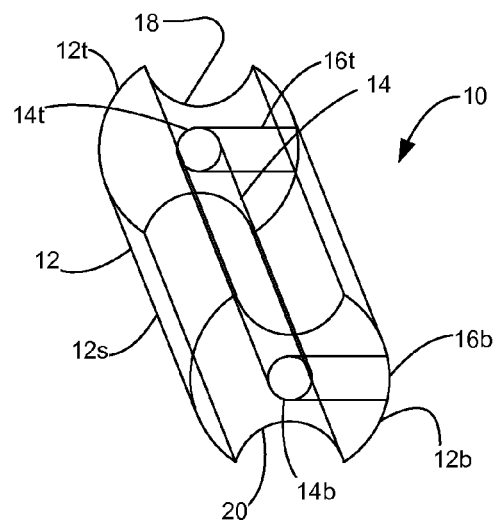
FIG. 2 is a transparent perspective view of the Z-directed component shown in FIG. 1 illustrating the internal arrangement of elements of the Z-directed component.

For example, FIGS. 1 and 2 show an embodiment of a Z-directed component 10. In this embodiment, Z-directed component 10 includes a generally cylindrical body 12 having a top surface 12$t$, a bottom surface 12$b$, a side surface 12$s$, and a length L generally corresponding to the depth D of the mounting hole. The length L can be less than, equal to or greater than the depth D. In the former two cases, Z-directed component 10 would in one case be below at least one of the top and bottom surfaces of the PCB and in the other it may be flush with the two surfaces of the PCB. Where length L is greater than depth D, Z-directed component 10 would not be flush mounted with at least one of the top and bottom surfaces of the PCB. However, with this non-flush mount, Z-directed component 10 would be capable of being used to interconnect to another component or another PCB that is positioned nearby. The mounting hole is typically a through-hole extending between the top and bottom surfaces of the PCB but it may also be a blind hole. When recessed below the surface of the PCB, additional resist areas may be required in the hole of the PCB to keep from plating the entire circumferential area around the hole.

Z-directed component 10 in one form may have at least one conductive channel 14 extending through an interior portion of body 12 along its length. Top and bottom conductive traces 16t, 16b are provided on the top and bottom end surfaces 12t, 12b of body 12 that extend from respective ends of the conductive channel 14 to the edge of Z-directed component 10. In this embodiment, body 12 comprises an insulator material. Depending on its function, body 12 of Z-directed component 10 may be made of a variety of materials having different properties. These properties include being conductive, resistive, magnetic, dielectric, or semi-conductive or various combinations of properties as described herein. Examples of materials that have the properties are copper, carbon, iron, ceramic or silicon, respectively. Body 12 of Z-directed component 10 may also comprise a number of different networks needed to operate a circuit that will be discussed later.

One or more longitudinally extending channels or wells may be provided on the side surface of body 12 of Z-directed component 10. The channel may extend from one of the top surface and the bottom surface of body 12 toward the opposite surface. As illustrated, two concave side wells or channels 18 and 20 are provided in the outer surface of Z-directed component 10 extending the length of body 12. When plated or soldered, these channels allow electrical connections to be made to Z-directed component 10, through the PCB, as well as to internal conductive layers within the PCB. The length of side channels 18 or 20 may extend less than the entire length of body 12.

FIG. 2 shows the same component as in FIG. 1 but with all the surfaces transparent. Conductive channel 14 is shown as a cylinder extending through the center of Z-directed component 10. Other shapes may also be used for conductive channel 14. Traces 16t and 16b can be seen extending from ends 14t and 14b of conductive channel 14, respectively, to the edge of body 12. While traces 16t and 16b are shown as being in alignment with one another (zero degrees apart), this is not a requirement and they may be positioned as needed for a particular design. For example, traces 16t and 16b may be 180 degrees apart or 90 degrees apart or any other increment.

Figure 3A:
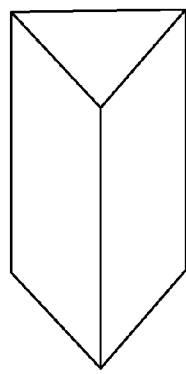
FIGS. 3A-3F are perspective views showing various example shapes for the body of a Z-directed component.
Figure 3B:
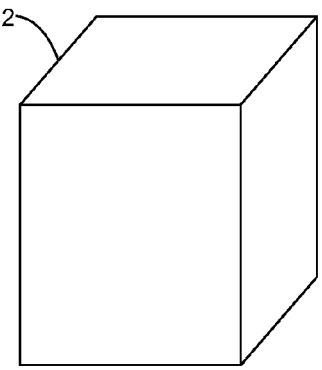
Figure 3C:
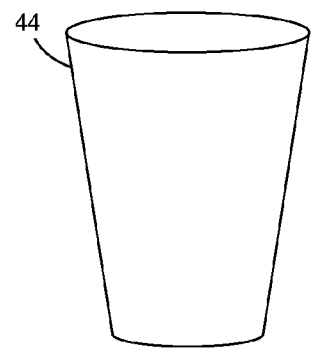
Figure 3D:
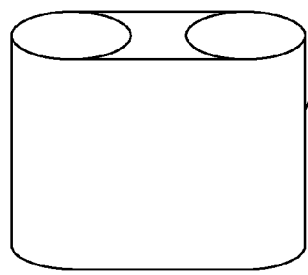
Figure 3E:
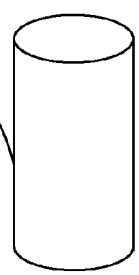
Figure 3F:
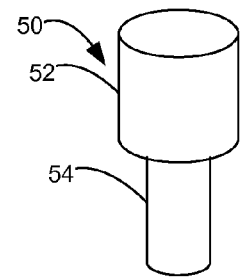

The shape of the body of the Z-directed component may be any shape that can fit into a mounting hole in a PCB. FIGS. 3A-3F illustrate possible body shapes for a Z-directed component. FIG. 3A shows a triangular cross-sectional body 40; FIG. 3B shows a rectangular cross-sectional body 42; FIG. 3C shows a frusto-conical body 44; FIG. 3D shows an ovate cross-sectional cylindrical body 46; and FIG. 3E shows a cylindrical body 48. FIG. 3F shows a stepped cylindrical body 50 where one portion 52 has a larger diameter than another portion 54. With this arrangement, the Z-directed component may be mounted on the surface of the PCB while having a section inserted into a mounting hole provided in the PCB. The edges of the Z-directed component may be beveled to help with aligning the Z-directed component for insertion into a mounting hole in a PCB. Other shapes and combinations of those illustrated may also be used for a Z-directed component as desired.

Figures 4A, 4B, 4C:
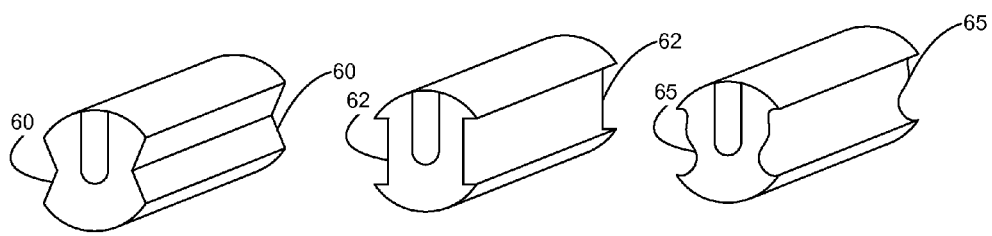
FIGS. 4A-4C are perspective views showing various example side channel configurations for a Z-directed component.

For a Z-directed component, the channels for plating can be of various cross-sectional shapes and lengths. The only requirement is that plating or solder material make the proper connections to the Z-directed component and corresponding conductive traces in or on the PCB. Side channels 18 or 20 may have, for example, V-, C- or U-shaped cross-sections, semi-circular or elliptical cross-sections. Where more than one channel is provided, each channel may have the same or a different cross-sectional shape. FIGS. 4A-4C illustrate three side channel shapes. In FIG. 4A, V-shaped side channels 60 are shown. In FIG. 4B, U-shaped side channels 62 are shown. In FIG. 4C, wavy or irregular cross-sectional side channel shapes 65 are shown. FIGS. 1 and 2 show C-shaped cross-sectional side channels 18, 20.

The numbers of layers in a PCB may vary from being single sided to being over 22 layers and may have different overall thicknesses that range from less than 0.051 inch to over 0.093 inch or more, or in one preferred embodiment between about 0.051 and about 0.093. Where a flush mount is desired, the length of the Z-directed component will depend on the thickness of the PCB into which it is intended to be inserted. The Z-directed component's length may also vary depending on the intended function and tolerance of a process. The preferred lengths will be where the Z-directed component is either flush with the surfaces or extends slightly beyond the surface of the PCB. This would keep the plating solution from plating completely around the interior of the PCB hole that may cause a short in some cases. It is possible to add a resist material around the interior of a PCB hole to only allow plating in the desired areas. However, there are some cases where it is desired to completely plate around the interior of a PCB hole above and below the Z-directed component. For example, if the top layer of the PCB is a supply voltage ($V_{CC}$) plane and the bottom layer is a ground voltage (GND) plane then a decoupling capacitor would have lower impedance if the connection used a greater volume of copper to make the connection.

There are a number of features that can be added to a Z-directed component to create different mechanical and electrical characteristics. The number of channels or conductors can be varied from zero to any number that can maintain enough strength to take the stresses of insertion, plating, manufacturing processes and operation of the PCB in its intended environment. The outer surface of a Z-directed component may have a coating that glues it in place. Flanges or radial projections may also be used to prevent over or under insertion of a Z-directed component into the mounting hole, particularly where the mounting hole is a through-hole. A surface coating material may also be used to promote or impede migration of the plating or solder material. Various locating or orienting features may be provided such as a recess or projection, or a visual or magnetic indicator on an end surface of the Z-directed component. Further, a connecting feature such as a conductive pad, a spring loaded style pogo-pin or even a simple spring may be included to add an additional electrical connection (such as frame ground) point to a PCB.

Figures 5A, 5B, 5C, 5D:
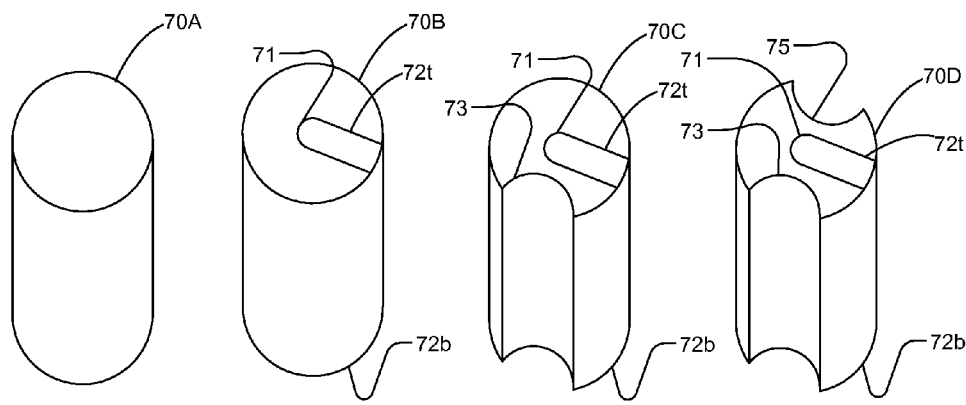
FIGS. 5A-5H are perspective views showing various example channel configurations for the body of a Z-directed component.
Figures 5E, 5F, 5G, 5H:
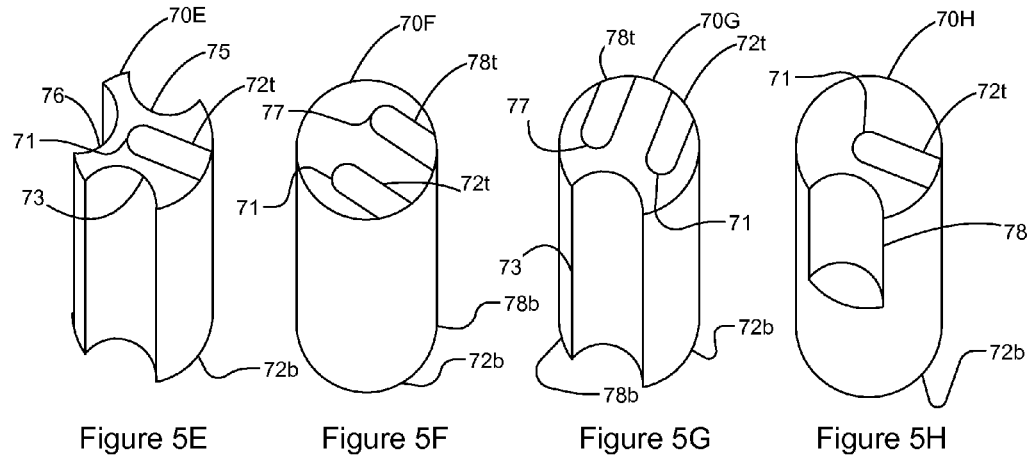

A Z-directed component may take on several roles depending on the number of ports or terminals needed to make connections to the PCB. Some possibilities are shown in FIGS. 5A-H. FIG. 5A is a Z-directed component configured as O-port device 70A used as a plug so that if a filter or a component is optional then the plug stops the hole from being plated. After the PCB has been manufactured, the O-port device 70A may be removed and another Z-directed component may be inserted, plated and connected to the circuit. FIGS. 5B-5H illustrate various configurations useful for multi-terminal devices such as resistors, diodes, transistors, and/or clock circuits. FIG. 5B shows a 1-port or single signal Z-directed component 70B having a conductive channel 71 through a center portion of the component connected to top and bottom conductive traces 72*t*, 72*b*. FIG. 5C shows a 1-port 1-channel Z-directed component 70C where one plated side well or channel 73 is provided in addition to conductive channel 71 through the component, which is connected to top and bottom conductive traces 72*t* and 72*b*. FIG. 5D shows a Z-directed component 70D having two side wells 73 and 75 in addition to conductive channel 71 through the component which is connected to top and bottom traces 72*t*, 72*b*. The Z-directed component 70E of FIG. 5E has three side wells 73, 75 and 76 in addition to conductive channel 71 through the component, which is connected to top and bottom traces 72*t*, 72*b*. FIG. 5F shows Z-directed component 70F having two conductive channels 71 and 77 through the component each with their respective top and bottom traces 72*t*, 72*b* and 78*t*, 78*b* and no side channels or wells. Z-directed component 70F is a two signal device to be primarily used for differential signaling. FIG. 5G shows a Z-directed component 70G having one side well 73 and two conductive channels 71 and 77 each with their respective top and bottom traces 72*t*, 72*b* and 78*t*, 78*b*. FIG. 5H shows Z-directed component 70H having one conductive channel 71 with top and bottom traces 72*t*, 72*b* and a blind well or partial well 78 extending from the top surface along a portion of the side surface that will allow the plating material or solder to stop at a given depth. For one skilled in the art, the number of wells and signals is only limited by the space, required well or channel sizes.

The various embodiments and features discussed for a Z-directed component are meant to be illustrative and not limiting. A Z-directed component may be made of a bulk material that performs a network function or may have other parts embedded into its body. A Z-directed component may be a multi-terminal device and, therefore, may be used to perform a variety of functions including, but not limited to: transmission lines, delay lines, T filters, decoupling capacitors, inductors, common mode chokes, resistors, differential pair pass throughs, differential ferrite beads, diodes, or ESD protection devices (varistors). Combinations of these functions may be provided within one component.

Figure 6:
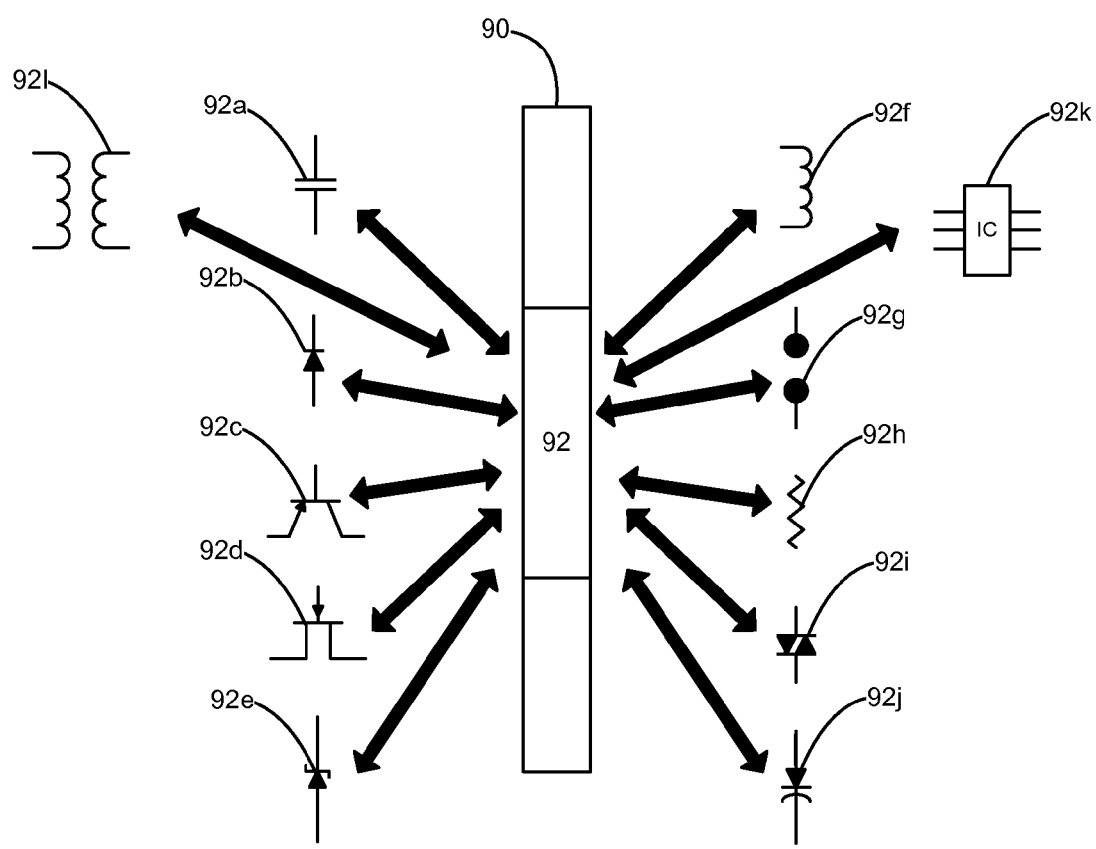
FIG. 6 is a schematic illustration of various example elements or electronic components that may be provided within the body of a Z-directed component in series with a conductive channel.

FIG. 6 illustrates various example configurations for a conductive channel in a Z-directed component. As shown, channel 90 has a region 92 intermediate the ends comprising a material having properties such as conductive, resistive, magnetic, dielectric, capacitive, semi-conductive properties or combinations thereof. These materials form a variety of components. Additionally, one or more components may be inserted or embedded into region 92 with portions of the conductive channel extending from the terminals of the component. A capacitor 92*a* may be provided in region 92. Similarly, a diode 92*b*, a transistor 92*c* such as a MOSFET 92*d*, a zener diode 92*e*, an inductor 92*f*, a surge suppressor 92*g*, a resistor 92*h*, a diac 92*i*, a varactor 92*j* and combinations of these items are further examples of materials that may be provided in region 92 of conductive channel 90. While region 92 is shown as being centered within the conductive channel 90, it is not limited to that location.

For a multi-terminal device such as transistor 92*c*, MOSFET 92*d*, an integrated circuit 92*k*, or a transformer 92*l*, one portion of the conductive channel may be between the top surface trace and a first terminal of the device and the other portion of the conductive channel between the bottom surface trace and a second terminal of the device. For additional device terminals, additional conductors may be provided in the body of the Z-directed component to allow electrical connection to the remaining terminals or additional conductive traces may be provided within the body of the Z-directed component between the additional terminals and channels on the side surface of the body of a Z-directed component allowing electrical connection to an external conductive trace. Various connection configurations to a multiple terminal device may be used in a Z-directed component.

Accordingly, those skilled in the art will appreciate that various types of Z-directed components may be utilized including, but not limited to, capacitors, delay lines, transistors, switches, and connectors. For example, FIGS. 7 and 8 illustrate a Z-directed component termed a signal pass-through that is used for passing a signal trace from the top surface of a PCB to the bottom surface.

Figure 7:
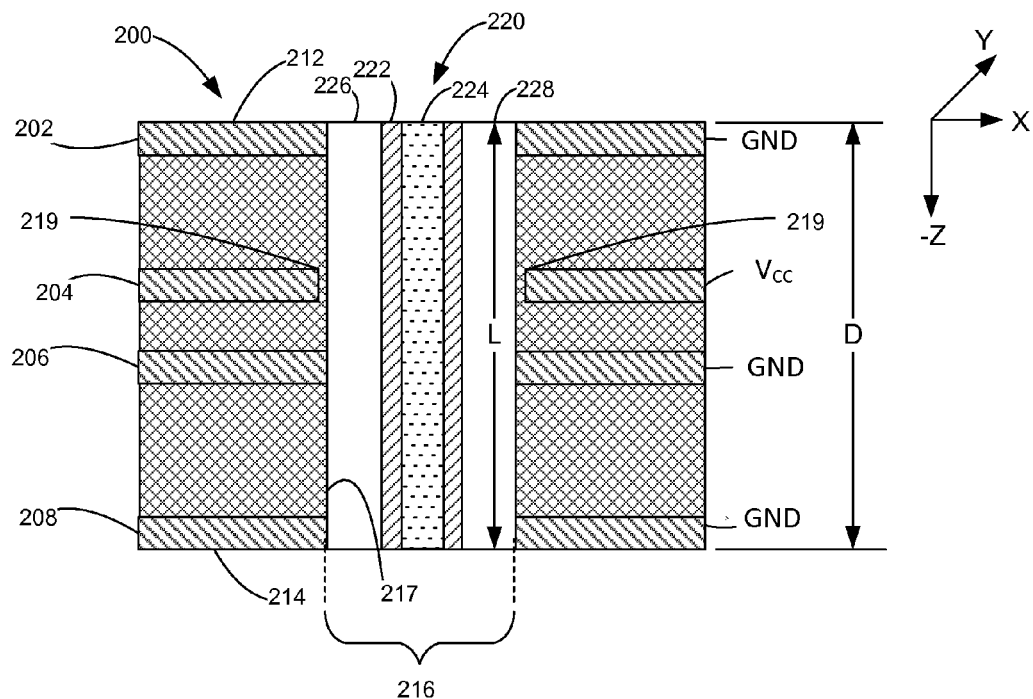
FIG. 7 is a schematic cross-sectional view of a Z-directed component flush mounted in a PCB showing conductive traces and connections to the Z-directed component according to one example embodiment.
Figure 8:
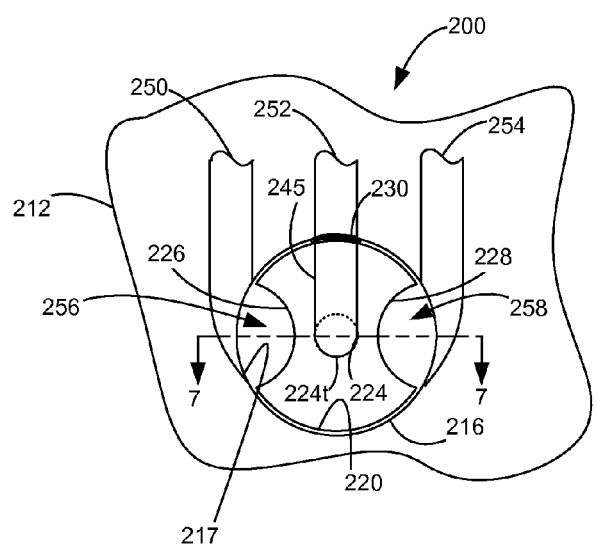
FIG. 8 is a top plan view of the Z-directed component and PCB shown in FIG. 8.

FIG. 7 shows a sectional view taken along line 7-7 in FIG. 8 of a PCB 200 having four conductive planes or layers comprising, from top to bottom, a ground (GND) plane or trace 202, a voltage supply plane ($V_{CC}$) 204, a second ground (GND) plane 206 and a third ground (GND) plane or trace 208 separated by nonconductive material such as a phenolic plastic, such as FR4, which is widely used as is known in the art. PCB 200 may be used for high frequency signals. The top and bottom ground planes or traces 202 and 208, respectively, on the top and bottom surfaces 212 and 214, respectively, of PCB 200 are connected to conductive traces leading up to Z-directed component 220. A mounting hole 216 having a depth D in a negative Z direction is provided in PCB 200 for the flush mounting of Z-directed component 220. Here depth D corresponds to the thickness of PCB 200; however, depth D may be less than the thickness of PCB 200 creating a blind hole therein. Mounting hole 216, as illustrated, is a through-hole that is round in cross-section to accommodate Z-directed component 220 but may have cross sections to accommodate the insertion of Z-directed components having other body configurations. In other words, mounting holes are sized so that Z-directed components are insertable therein. For example, a Z-directed component having a cylindrical shape may be inserted into a square mounting hole and vice versa. In the cases where the Z-directed component does not make a tight fit, resist materials will have to be added to the areas of the component and PCB where copper plating is not desired.

Z-directed component 220 is illustrated as a three lead component that is flush mounted with respect to both the top surface 212 and bottom surface 214 of PCB 200. Z-directed component 220 is illustrated as having a generally cylindrical body 222 of a length L. A center conductive channel or lead 224, illustrated as being cylindrical, is shown extending the length of body 222. Two concave side wells or channels 226 and 228, which define the other two leads, are provided on the side surface of Z-directed component 220 extending the length of body 222. Side channels 226 and 228 are plated for making electrical connections to Z-directed component 220 from various layers of PCB 200. As shown, the ground plane traces on layers 202, 206, and 208 of PCB 100 are electrically connected to side channels 226 and 228. $V_{CC}$ plane 204 does not connect to Z-directed component 220 as shown by the gap 219 between $V_{CC}$ plane 204 and wall 217 of mounting hole 216.

FIG. 8 illustrates a top view of Z-directed component 220 in PCB 200. Three conductive traces 250, 252 and 254 lead up to the edge of wall 217 of mounting hole 216. As illustrated, trace 252 serves as a high-frequency signal trace to be passed from the top surface 212 to the bottom surface 214 of PCB 200 via Z-directed component 220. Conductive traces 250 and 254 serve as ground nets. Center lead or conductive channel 224 is electrically connected to trace 252 on the top surface 212 of PCB 200 by a top trace 245 and plating bridge 230. Top trace 245 on the top surface of Z-directed component 220 extends from the top end 224t of conductive channel 224 to the edge of Z-directed component 220. Although not shown, the bottom side of Z-directed component 220 and bottom surface 214 of PCB 200 is configured in a similar arrangement of traces as shown on top surface 212 of PCB 200 illustrated in FIG. 8. A bottom trace on the bottom surface of Z-directed component 220 extends from the bottom of conductive channel 224 to the edge of Z-directed component 220. A plating bridge is used to make the electrical connection between the bottom trace and another high frequency signal trace provided on the bottom surface of PCB 200. The transmission line impedance of the Z-directed component can be adjusted to match the PCB trace impedance by controlling the conductor sizes and distances between each conductor which improves the high speed performance of the PCB. For example, each of the electrical paths formed by the Z-directed component shown in FIG. 8, e.g., the electrical path formed by conductor 244, trace 245, and trace 252, has a substantially uniform width in order to control the transmission line impedance through the path (see also FIGS. 1 and 2).

During the plating process, wells 256 and 258 formed between wall 217 of mounting hole 216 and side channels 226 and 228 allow plating material or solder to pass from the top surface 212 to the bottom surface 214 electrically interconnecting traces 250 and 254, respectively, to side channels 226 and 228, respectively, of Z-directed component 220 and also to similarly situated traces provided on the bottom surface 214 of PCB 200 interconnecting ground planes or traces 202, 206 and 208. The plating is not shown for purposes of illustrating the structure. In this embodiment, $V_{CC}$ plane 204 does not connect to Z-directed component 220.

One of the challenges for high frequency signal speeds is the reflections and discontinuities due to signal trace transmission line impedance changes. Many PCB layouts try to keep high frequency signals on one layer because of these discontinuities caused by the routing of signal traces through the PCB. Standard vias through a PCB have to be spaced some distance apart which creates high impedance between the signal via and the return signal via or ground via. As illustrated in FIGS. 7 and 8, the Z-directed component and the return ground or signals have a very close and controlled proximity that allow more constant impedance from the top surface 212 to the bottom surface 214 of PCB 200.

Figure 9:
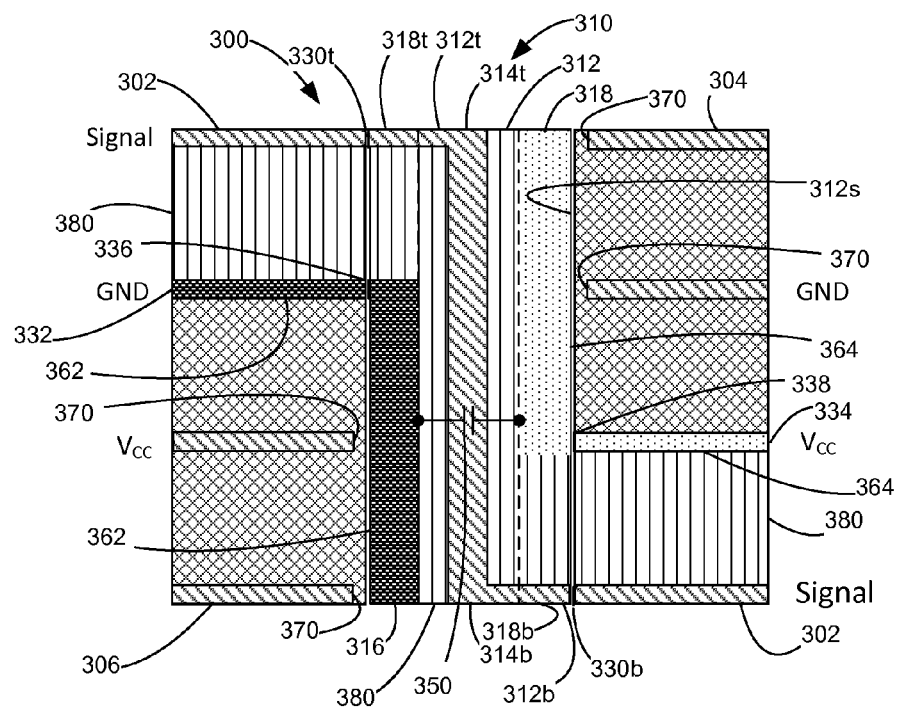
FIG. 9 is a schematic cross-sectional view of a Z-directed component flush mounted in a PCB showing ground loops for the Z-directed component with the Z-directed component further having a decoupling capacitor within its body according to one example embodiment.

A Z-directed signal pass through component may also comprise a decoupling capacitor that will allow the reference plane of a signal to switch from a ground plane, designated GND, to a voltage supply plane, designated $V_{CC}$, without having a high frequency discontinuity. FIG. 9 shows a cross-sectional view of a typical 4-layer PCB 300 with a signal trace 302 transferring between the top layer 304 and the bottom layer 306. Z-directed component 310, similar to that shown in FIG. 5D, having body 312 connects signal trace 302 through center conductive channel 314. Z-directed component 310 also comprises plated side channels 316 and 318 extending along the side surface 312s of the body 312. The top 314t and bottom 314b of conductive channel 314 are connected to conductive traces 318t and 318b on the top 312t and bottom 312b of body 312. These, in turn, are connected to signal trace 302 via top and bottom plating bridges 330t and 330b. Side channels 316 and 318 are plated to GND plane 332 and $V_{CC}$ plane 334, respectively. Connection points 336 and 338, respectively, illustrate this electrical connection. Schematically illustrated decoupling capacitor 350 is internal to body 312 and is connected between side channels 316 and 318. Decoupling capacitor 350 may be a separate capacitor integrated into the body 312 of Z-directed component 310 or it can be formed by fabricating a portion of the body 312 of Z-directed component 310 from the required materials with dielectric properties between conductive surfaces.

The path for signal trace 302 is illustrated with diagonal hatching and can be seen to run from top layer 304 to bottom layer 306. GND plane 332 and side channel 316 are electrically connected at 336 with the signal path return indicated by the dark stippling 362. $V_{CC}$ plane 334 and side channel 318 are electrically connected at 338 with the signal path return indicated by the light stippling 364. As is known in the art, where a signal plane or trace is not to be connected to the inserted part, those portions are spaced apart from the component as shown at 370. Where a signal plane or trace is to be connected to an inserted component, the signal plane or trace is provided at the wall or edge of the opening to allow the plating material or solder to bridge therebetween as illustrated at points 330t, 330b, 336, and 338.

The vertically hatched portion 380 shows the high speed loop area between the signal trace and return current path described by the signal trace 302 and the GND plane 332 or $V_{CC}$ plane 334. The signal trace 302 on the bottom surface 306 is referenced to power plane $V_{CC}$ 334 that is coupled to the GND plane 332 through decoupling capacitor 350. This coupling between the two planes will keep the high frequency impedance close to constant for the transition from one return plane to another plane of a different DC voltage.

Figure 10:
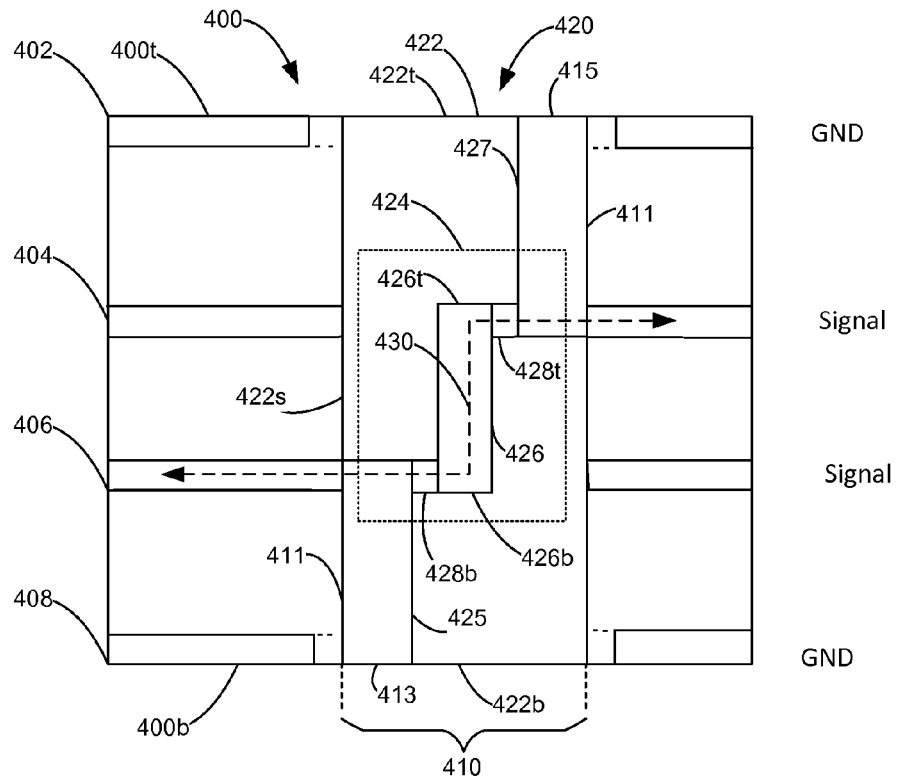
FIG. 10 is a schematic cross-sectional view of a Z-directed component flush mounted in a PCB showing a Z-directed component for transferring a signal trace from one internal layer of a PCB to another internal layer of that PCB according to one example embodiment.

Internally mounting Z-directed components in a PCB greatly facilitates the PCB technique of using outer ground planes for EMI reduction. With this technique, signals are routed on the inner layers as much as possible. FIG. 10 illustrates one embodiment of this technique. PCB 400 is comprised of, from top to bottom, top ground layer 402, internal signal layer 404, internal signal layer 406 and bottom ground layer 408. Ground layers 402 and 408 are on the top and bottom surfaces 400t and 400b of PCB 400. A mounting hole 410, shown as a through-hole, extends between the top and bottom surfaces 400t and 400b. Z-directed component 420 is shown flush mounted in PCB 400. Z-directed component 420 comprises body 422 having a center region 424 intermediate the top 422t and bottom 422b of body 422 and two side channels 425 and 427 on side surface 422s.

Side channels 425 and 427 and wall 411 of hole 410 form plating wells 413 and 415 respectively. Center region 424 is positioned within body 422 and extends a distance approximately equal to the distance separating the two internal signal layers 404 and 406. Side channel 425 extends from the bottom surface 422b of body 422 to internal signal level 406 while side channel 427 extends from top surface 422t of body 422 to internal signal level 404. Here, side channels 425 and 427 extend only along a portion of side surface 422s of body 422. Conductive channel 426 extends through center region 424 but does not extend to the top and bottom surfaces 422t, 422b of body 422. FIG. 5H illustrates a partial channel similar to side channel 427. Conductive channel 426 has conductive traces 428t and 428b extending from the top 426t and bottom 426b of conductive channel 426 to side channels 427 and 425, respectively. While illustrated as separate elements, conductive channel 426 and traces 428t, 428b may be one integrated conductor electrically interconnecting side channels 425, 427. As shown, conductive trace 428b is connected to internal signal layer 406 via plated side channel 425 and well 413 while trace 428t connects to internal signal level 404 via side channel 427 and well 415. Ground layers 402 and 408 are not connected to Z-directed component 420 and are spaced away from mounting hole 410 as previously described for FIGS. 7 and 9. As shown by double headed dashed arrow 430, a signal on signal layer 406 can be transmitted to signal layer 404 (or vice versa) via Z-directed component 420 through a path extending from well 413, side channel 425, trace 428*b*, conductive channel 426, trace 428*t*, side channel 427, and well 415 to allow the signal to remain on the inner layers of PCB 400 with ground layers 402 and 408 providing shielding.

Figure 11:
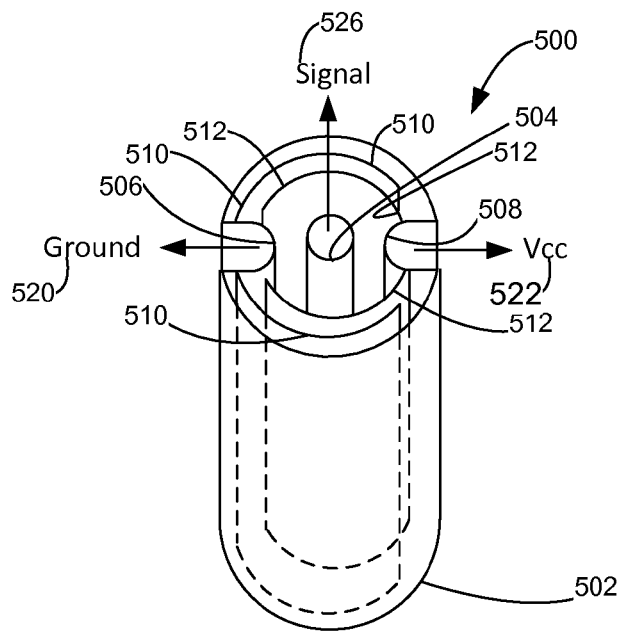
FIG. 11 is a perspective view of a Z-directed capacitor having vertically oriented conductive sheets according to one example embodiment.
Figure 12:
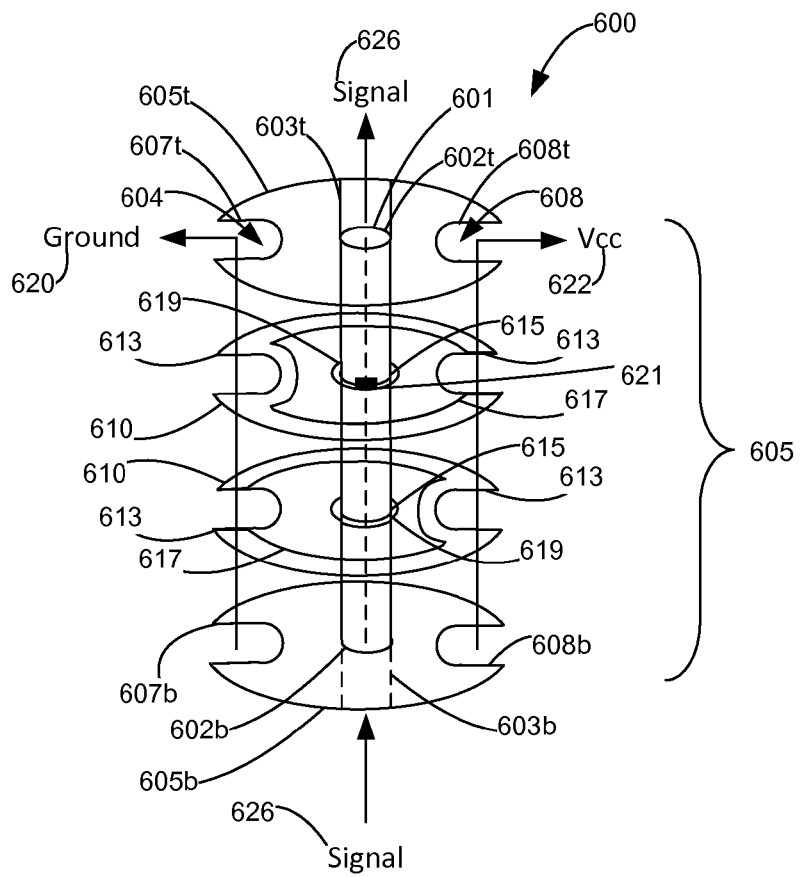
FIG. 12 is an exploded view of a Z-directed capacitor having stacked layers according to one example embodiment.

FIGS. 11 and 12 illustrate two additional example Z-directed components in the form of decoupling capacitors. In FIG. 11, a Z-directed capacitor 500 is shown with a body 502 having a conductive channel 504 and two side channels 506 and 508 extending along its length similar to those previously described. Conductive channel 504 is shown connected to a signal 526. Vertically oriented interleaved partial cylindrical sheets 510, 512 forming the plates of Z-directed capacitor 500 are connected to reference voltages such as supply voltage $V_{CC}$ and ground (or any other signals requiring capacitance) and are used with intervening layers of dielectric material (not shown). Partial cylindrical sheet 510 is connected to plated channel 506 which is connected to ground 520. Partial cylindrical sheet 512 is connected to plated channel 508 which is connected to supply voltage $V_{CC}$ 522. Sheets 510, 512 may be formed of copper, aluminum or other material with high conductivity. The material between the partial cylindrical sheets is a material with dielectric properties. Only one partial cylindrical sheet is shown connected to each of $V_{CC}$ 522 and ground 520; however, additional partial cylindrical sheets may be provided to achieve the desired capacitance/voltage rating.

Another embodiment of a Z-directed capacitor is shown in FIG. 12 using stacked layers connected to voltage $V_{CC}$ or ground. Z-directed capacitor 600 is comprised of center conductive channel 601 and a body 605 comprised of a top member 605*t*, a bottom member 605*b*, and a plurality of layers or support members 610 (illustrated as disks) between the top and bottom members 605*t*, 605*b*.

Center conductive channel 601 extends through openings 615 in the assembled Z-directed capacitor 600 and openings 602*t* and 602*b*, all of which are sized to closely receive the center conductor. Center conductive channel 601 is electrically connectable to conductive traces 603*t* and 603*b* on the top and bottom portions 605*t*, 605*b* forming a signal path for signal 626. This connection is made by plating or soldering. Center conductive channel 601 is connected to signal 626 via conductive trace 603*t*. The bottom end of conductive channel 601 is connected in a similar fashion to a signal trace (not shown) via conductive trace 603*b*.

Opposed openings 607*t* and 608*t* are provided at the edge of top portion 605*t*. Bottom portion 605*b* is of similar construction as top portion 605*t* having opposed openings 607*b* and 608*b* provided at the edge. Between top and bottom portions 605*t*, 605*b* are a plurality of support members 610, which provide the capacitive feature. Support members 610 each have at least one opening 613 at their outer edge and an inner hole 615 allowing for passage of conductive channel 601 therethrough. As shown, two opposed openings 613 are provided in each support member 610. When assembled, the opposed openings 607*t*, 607*b*, 608*t*, 608*b*, and 613 align to form opposed side channels 604 and 608 extending along the side surface of Z-directed capacitor 600. Side channel 604 is shown connected to reference voltage such as ground 620 and side channel 606 to another reference voltage such as $V_{CC}$ 622. Support members 610 may be fabricated from a dielectric material and may be all of the same or varying thickness allowing for choice in designing the desired properties for Z-directed capacitor 600.

Annular plating 617 is provided on one of top and bottom surfaces of support member 610 or, if desired, on both surfaces. Annular plating is shown on the top surface of each support member but the location of the annular plating can vary from support member to support member. Annular plating 617 generally conforms to the shape of the support member and extends from one of the edge openings 613 toward the other if an additional opening is provided. The annular plate 617 is of a diameter or dimension or overall size that is less than the diameter, dimension or overall size of support member 610 on which it is affixed. While the plate 617 is described as annular, other shapes may also be used provided that the plating does not contact the center conductive channel or extend to the edge of the support member on which it is plated or otherwise affixed. The annular plate does contact one of the edge openings 613 but is spaced apart from the other openings if more than one channel is present in the side surface of the body of Z-directed capacitor 600. Also, there is an opening 619 in annular plate 617 having a larger diameter than opening 615 in annular plate 617 through which conductive channel 601 passes. Opening 619 has a larger diameter than that of conductive channel 601 leaving annular plate 617 spaced apart from conductive channel 601.

As illustrated, the support members 610 are substantially identical except that when stacked, alternate members are rotated 180 degrees with respect to the member above or below it. This may be referred to as a 1-1 configuration. In this way, alternate members will be connected to one or the other of the two side channels. As shown in FIG. 12, the annular plating on the upper one of the two support members 610 is connected to side channel 608 and voltage $V_{CC}$ 622 while the annular plating on the lower one of the two support members 610 is connected to side channel 604 and ground 620. Other support member arrangements may also be used such as having two adjacent members connected to the same channel with the next support member being connected to the opposite channel which may be referred to as a 2-1 configuration. Other configurations may include 2-2, 3-1 and are a matter of design choice. The desired capacitance or voltage rating determines the number of support members that are inserted between top and bottom portions 605*t*, 605*b*. Although not shown, additional dielectric members comprised of dielectric material and similarly shaped to support members 610 may be interleaved with support members 610. Based on design choice, only a single channel may be used or more channels may be provided and/or the annular plating may be brought into contact with the center conductive channel and not in contact with the side channels. Again, the embodiments for Z-directed capacitors are for purposes of illustration and are not meant to be limiting.

With either design for a Z-directed capacitor, a second conductive channel may be provided in parallel with the first conductive channel that is disposed within the conductive plates to create a differential decoupling capacitor. Another embodiment of a Z-directed capacitor can be constructed from FIG. 11 or FIG. 12 by connecting the center conductive channel to one of the reference voltages at each support member that also has its annular plating connected to the same reference voltage. This may be accomplished simply by connecting the conductive channel to the annular plating as schematically illustrated by the jumper 621. In practice, the annular opening 619 in the annular plate 617 would be sized so that the annular plate and conductive channel 601 would be electrically connected. This component may be placed directly below a power pin or ball of an integrated circuit or other surface mounted component for optimum decoupling placement.

Again, the Z-directed signal pass-through components illustrated in FIGS. 7-10 and the Z-directed decoupling capacitors illustrated in FIGS. 11 and 12 provide merely a few example applications of a Z-directed component. Those skilled in the art will appreciate that various other types of Z-directed components may be utilized including, but not limited to, transmission lines, delay lines, T filters, decoupling capacitors, inductors, common mode chokes, resistors, differential pair pass throughs, differential ferrite beads, diodes, or ESD protection devices (varistors).

The Z-directed components may be constructed on a commercial scale according to various methods. For example, the following co-pending U.S. patent applications, which are assigned to the assignee of the present application, describe various manufacturing processes for producing Z-directed components: U.S. patent application Ser. No. 13/222,748, filed Aug. 31, 2011, entitled "Die Press Process for Manufacturing a Z-Directed Component for a Printed Circuit Board," U.S. patent application Ser. No. 13/222,418, filed Aug. 31, 2011, entitled "Screening Process for Manufacturing a Z-Directed Component for a Printed Circuit Board," U.S. patent application Ser. No. 13/222,376, filed Aug. 31, 2011, entitled "Spin Coat Process for Manufacturing a Z-Directed Component for a Printed Circuit Board," U.S. patent application Ser. No. 13/250,812, filed Sep. 30, 2011, entitled "Extrusion Process for Manufacturing a Z-Directed Component for a Printed Circuit Board," and U.S. patent application Ser. No. 13/284,084, filed Oct. 28, 2011, entitled "Continuous Extrusion Process for Manufacturing a Z-Directed Component for a Printed Circuit Board."

Transmission Line Impedance Control Through the Z-Directed Component

Figure 13:
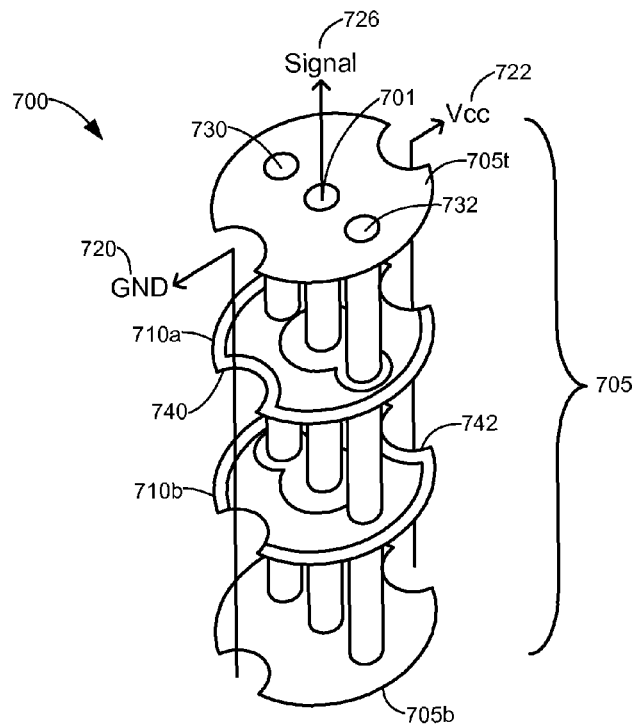
FIG. 13 is an exploded view of a Z-directed capacitor having stacked layers and a pair of conductive channels next to a signal path through the component according to one example embodiment.

With reference to FIG. 13, a Z-directed capacitor 700 is shown according to one example embodiment. Z-directed capacitor 700 is substantially the same as Z-directed capacitor 600 discussed above with respect to FIG. 12 except that Z-directed capacitor 700 includes a pair of conductive channels 730, 732 that extend through an interior portion of the body 705 of the component along its length. Conductive channels 730, 732 are positioned next to, and on opposite sides of, center conductive channel 701. As discussed above, body 705 includes a top member 705t, a bottom member 705b, and a plurality of alternating support members 710, such as disks, between the top and bottom members 705t, 705b. Center conductive channel 701 forms a signal path for signal 726. Z-directed capacitor 700 includes a pair of opposed side channels 740, 742 plated with conductive material. In the example embodiment illustrated, side channel 740 is connected to a reference voltage such as ground (GND) 720 and side channel 742 is connected to another voltage such as a supply voltage ($V_{CC}$) 722.

Figure 14A:
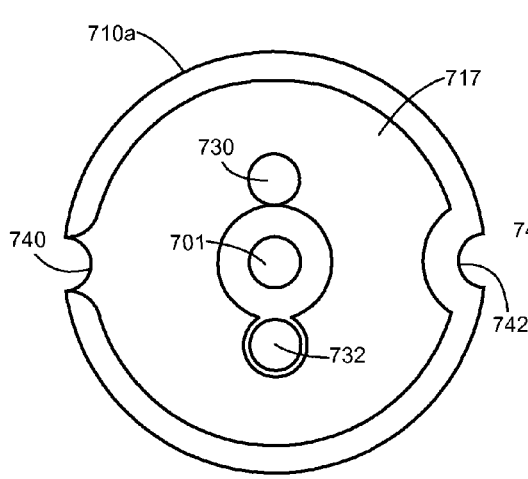
FIGS. 14A and 14B are plan views of a pair of support members of the Z-directed capacitor shown in FIG. 13.
Figure 14B:
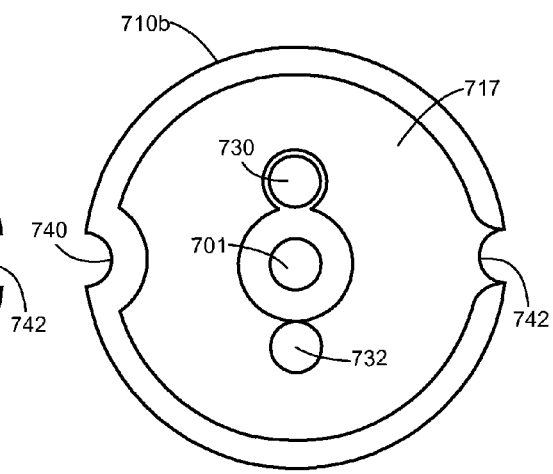

Conductive channels 730, 732 extend through corresponding openings in Z-directed capacitor 700 which are sized to closely receive the respective conductive channel 730, 732. FIGS. 14A and 14B show a first support member 710a and a second support member 710b of Z-directed capacitor 700, respectively, in closer detail. FIGS. 14A and 14B show side channels 740, 742 which are plated with conductive material. As shown in FIG. 14A, in the example embodiment illustrated, conductive channel 730 is connected to side channel 740 and GND 720 via annular plating 717 on the surface of first support member 710a; however, annular plating 717 is spaced from and does not contact conductive channel 732 or side channel 742. As shown in FIG. 14B, conductive channel 732 is instead connected to side channel 742 and $V_{CC}$ 722 via annular plating 717 on the top surface of second support member 710b. Conductive channel 730 and side channel 740 are spaced from and do not contact annular plating 717 on second support member 710b. Center conductive channel 701 is spaced from and does not contact annular plating 717 on first support member 710a or second support member 710b. Accordingly, in the example embodiment shown, conductive channels 730, 732 and center conductive channel 701 may be referred to as forming a power-signal-ground (P-S-G) configuration as a result of their physical alignment. Alternatively, conductive channels 730, 732 and center conductive channel 701 may form a power-signal-power (P-S-P) configuration (by connecting both conductive channels 730, 732 to side channel 742 and $V_{CC}$ 722) or a ground-signal-ground (G-S-G) configuration (by connecting both conductive channels 730, 732 to side channel 740 and GND 720). Further, as discussed above, support members 710a, 710b may alternate to form any pattern desired, such as 1-1, 2-1, 2-2, 3-1, etc.

As is known in the art, the transmission line impedance through signal 726 depends in part on the distances between center conductive channel 701 and side channels 740, 742 and the distances between center conductive channel 701 and conductive channels 730, 732. The impedance also depends on the capacitance between the alternating support members 710. By positioning conductive channels 730, 732 next to center conductive channel 701, the continuity of the transmission line impedance through signal 726 of Z-directed capacitor 700 is improved in comparison with Z-directed capacitor 600 shown in FIG. 12, which does not include the additional pair of interior conductive channels 730, 732. Specifically, the placement of conductive channels 730, 732 close to center conductive channel 701 minimizes the effects of side channels 740, 742 and alternating support members 710 on the transmission line impedance through the component. Without conductive channels 730, 732, the alternating relationship of support members 610 of Z-directed capacitor 600 alters the impedance of signal 626 as it moves through the component. Conductive channels 730, 732 reduce this parasitic effect and permit more constant impedance through the component as a result.

Figure 15:
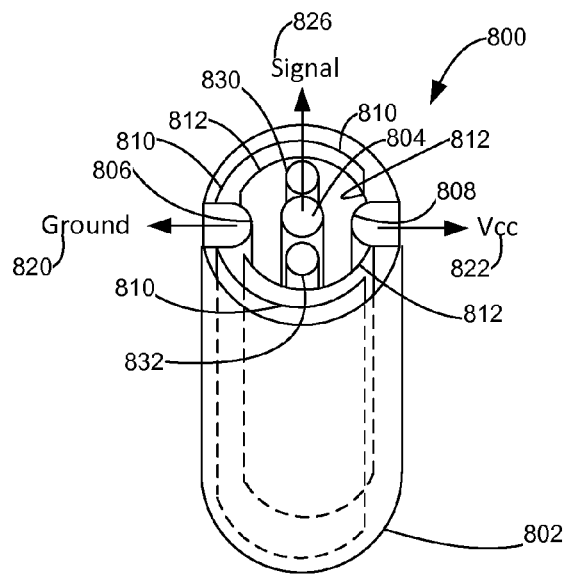
FIG. 15 is a perspective view of a Z-directed capacitor having vertically oriented conductive sheets and a pair of conductive channels next to a signal path through the component according to one example embodiment.

It will be appreciated that Z-directed capacitor 500 discussed above with respect to FIG. 11 may also be modified to include a pair of conductive channels next to and on opposite sides of signal 526 in order to reduce any discontinuities caused by conductive side channels 506, 508 and sheets 510, 512. For example, FIG. 15 shows a Z-directed capacitor 800 having a body 802. Z-directed capacitor 800 is substantially the same as Z-directed capacitor 500 discussed above with respect to FIG. 11 except that Z-directed capacitor 800 includes a pair of conductive channels 830, 832 that extend through an interior portion of the component along its length. A conductive channel 804 extends through a center portion of body 802 along the length of body 802. Conductive channels 830, 832 are positioned next to, and on opposite sides of, center conductive channel 804. Body 802 also includes a pair of plated side channels 806, 808 that extend along its length as discussed above. In this example, conductive channel 804 is connected to a signal 826. Plated channel 806 is connected to ground 820 and plated channel 808 is connected to supply voltage $V_{CC}$ 822. Vertically oriented interleaved partial cylindrical sheets 810, 812 forming the plates of Z-directed capacitor 800 are connected to side channels 806, 808, respectively. A dielectric material is positioned between partial cylindrical sheets 810, 812. Depending on the configuration desired (i.e., P-S-G, P-S-P, or G-S-G), conductive channels 830, 832 may be connected to plated channel 806 and ground (GND) 820 or plated channel 808 and supply voltage ($V_{CC}$) 822. This connection may be established by connecting the conductive channel 830, 832 to one of its corresponding cylindrical sheets 810, 812. Conductive channels 830, 832 reduce the effects of side channels 806, 808 and sheets 810, 812 on the transmission line impedance of signal 826 and thereby allow for more constant transmission line impedance through the component.

Figure 16:
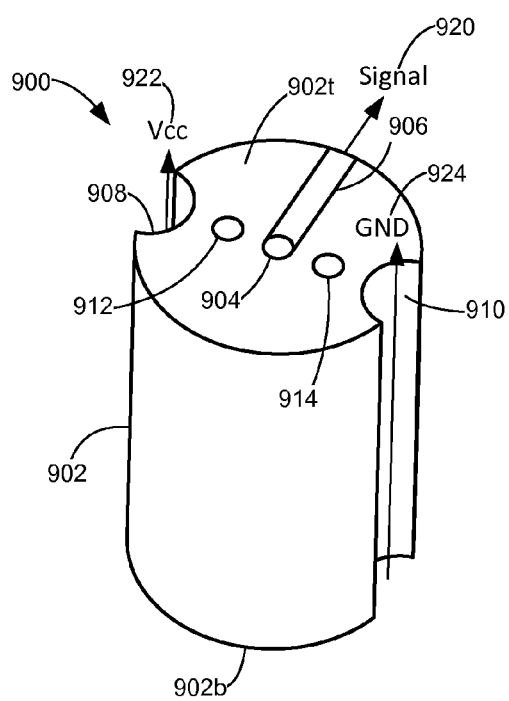
FIG. 16 is a perspective view of a Z-directed signal pass-through component having a pair of conductive channels next to a signal path through the component according to one example embodiment.

While the example embodiments illustrated in FIGS. 13-15 relate to Z-directed capacitors, any Z-directed component having a signal passing through an interior conductive channel may use a pair of adjacent, interior conductive channels to control the transmission line impedance through the signal. For example, FIG. 16 illustrates a Z-directed signal pass-through component 900 similar to component 200 discussed above with respect to FIGS. 7 and 8. Component 900 includes a body 902 having a top surface 902*t* and a bottom surface 902*b*. A conductive channel 904 extends through a center portion of body 902 along its length. Conductive channel 904 is connected to a signal 920 by a trace 906 that extends from conductive channel 904 across top surface 902*t* to an edge of component 900. Similarly, bottom surface 902*b* of component 900 includes a corresponding trace (not shown) that connects conductive channel 904 to an edge of the component. Body 902 also includes a pair of conductive side channels 908, 910. A pair of conductive channels 912, 914 extend through an interior portion of body 902 along its length next to and on opposite sides of conductive channel 904. Each conductive channel 912, 914 is connected to either side channel 908 or side channel 910. This connection may be established by a trace on top surface 902*t* or bottom surface 902*b* or by connecting the conductive channel to its corresponding side channel 912 or 914 on an internal portion of the component between top surface 902*t* and bottom surface 902*b*. Where a power-signal-ground configuration is desired, conductive channel 912 may be connected to side channel 908 which may in turn be connected to a supply voltage ($V_{CC}$) 922 and conductive channel 914 may be connected to side channel 910 which may be in turn connected to a ground (GND) 924. As discussed above, a ground-signal-ground or power-signal-power configuration may also be used as desired.

Figure 17:
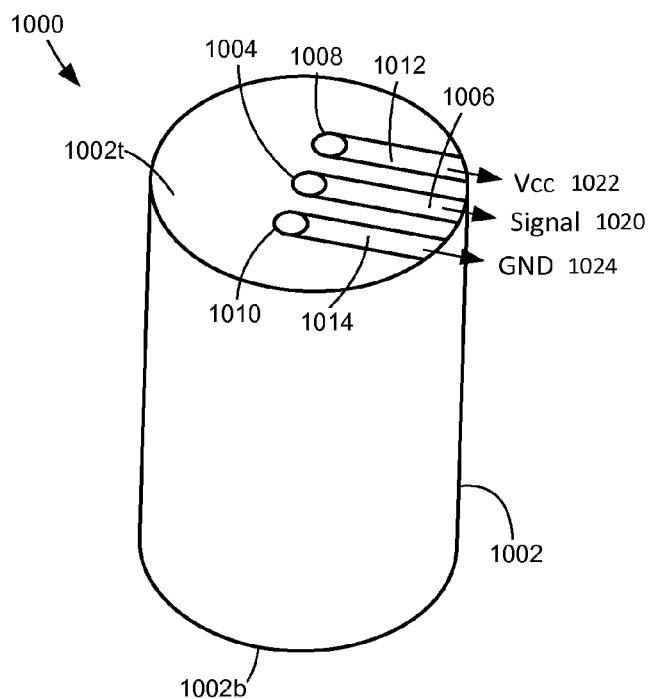
FIG. 17 is a perspective view of a Z-directed signal pass-through component having a pair of conductive channels next to a signal path through the component according to another example embodiment.

FIG. 17 illustrates another example of a Z-directed signal pass-through component 1000. Component 1000 includes a body 1002 having a top surface 1002*t* and a bottom surface 1002*b*. Unlike signal pass-through component 900, body 1002 of component 1000 does not include side channels therein. A conductive channel 1004 extends through a center portion of body 1002 along its length. Conductive channel 1004 is connected to a signal 1020 by a trace 1006 that extends across top surface 1002*t* and another trace (not shown) that extends across bottom surface 1002*b* from conductive channel 1004 to an edge of component 1000. A pair of conductive channels 1008, 1010 extend through an interior portion of body 1002 along its length next to and on opposite sides of conductive channel 1004. Each conductive channel 1008, 1010 includes a respective trace 1012, 1014 that extends from the conductive channel 1008, 1010 across top surface 1002*t* to the edge of component 1000. Again, bottom surface 1002*b* includes a corresponding pair of conductive traces that connect conductive channels 1008, 1010 to an edge of the component. Where a power-signal-ground configuration is desired, conductive channel 1008 may be connected to a supply voltage $V_{CC}$ 1022 by trace 1012 and the corresponding trace on bottom surface 1002*b* and conductive channel 1010 may be connected to a ground GND 1024 by trace 1014 and the corresponding trace on bottom surface 1002*b*.

Figure 18:
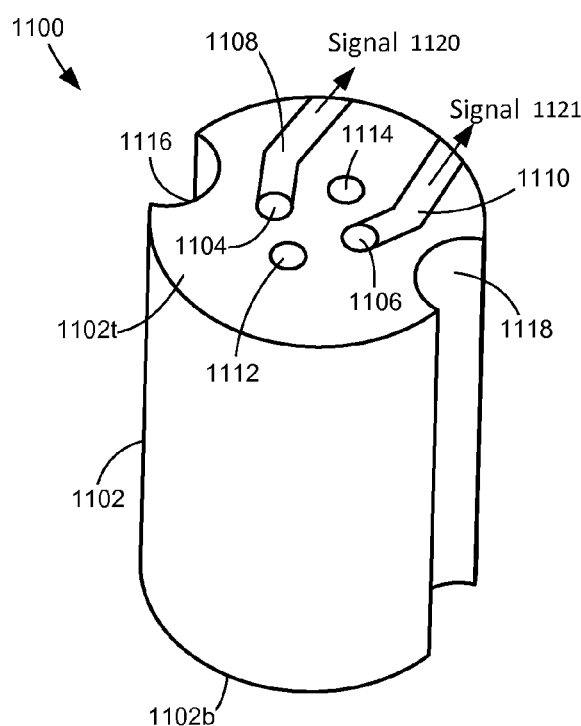
FIG. 18 is a perspective view of a Z-directed signal pass-through component having a differential signal according to one example embodiment.

A pair of adjacent, interior conductive channels may also be used to control the transmission line impedance through a component having a differential signal including any number of signals passing through the interior of the component. For example, FIG. 18 shows a Z-directed pass-through component 1100 having body 1102 that includes a pair of conductive channels 1104, 1106 extending through a center portion of body 1102 along its length. Each conductive channel 1104, 1106 is connected to a respective signal 1120, 1121 by a corresponding trace 1108, 1110 on a top surface 1002*t* and a bottom surface 1102*b* of body 1102. A pair of conductive channels 1112, 1114 extend through an interior portion of body 1102 along its length next to and on opposite sides of conductive channels 1104, 1106 in order to provide more constant impedance through signals 1120, 1121. Each conductive channel 1112, 1114 may be connected to a supply voltage ($V_{CC}$) or a ground voltage by a respective trace across top surface 1102*t* or bottom surface 1002*b* or via a connection to a respective plated side channel 1116, 1118 as discussed above. Conductive channels 1112, 1114 may both be connected to the supply voltage $V_{CC}$ or the ground or one of conductive channels 1112, 1114 may be connected to supply voltage $V_{CC}$ and the other to the ground. For a Z-directed component having multiple signals, it will be appreciated that conductive channels 1112, 1114 will aid in controlling the common mode (or even mode) impedance but will not affect the differential impedance between the signals.

Figure 19:
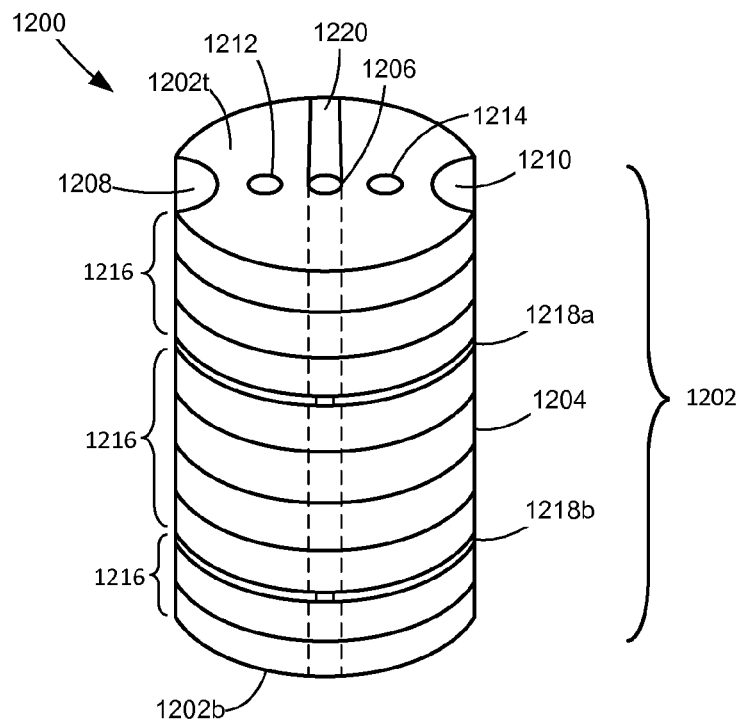
FIG. 19 is a perspective view of a Z-directed capacitor comprised of multiple stacked layers having different dielectric constants according to one example embodiment.

In some embodiments of a Z-directed capacitor, it is preferred to have a high capacitance through the plates forming the capacitor while maintaining the transmission line impedance of the signal at a nominal value. FIG. 19 shows a Z-directed capacitor 1200. Z-directed capacitor 1200 has a body 1202 that includes a stack of plated support members (or layers) 1204, which may be arranged in a 1-1, 2-1, etc. configuration as discussed above with respect to FIGS. 12 and 13. A center conductive channel 1206 extends through an interior portion of body 1202 along its length forming a signal path. Body 1202 also includes a pair of plated side channels 1208, 1210 that may be connected to a supply voltage ($V_{CC}$ and a reference voltage (GND), respectively. A pair of conductive channels 1212, 1214 extend through the interior of body 1202 along its length next to and on opposite sides of center conductive channel 1206 in order to reduce the impedance along the signal path formed by center conductive channel 1206 as discussed above. Conductive channels 1212, 1214 are connected to either side channel 1208 or side channel 1210 depending on the configuration desired (i.e., P-S-G, P-S-P or G-S-G).

Both a top portion 1202*t* and a bottom portion 1202*b* of body 1202 include one or more support members 1216 having a relatively low dielectric constant ($\epsilon_r$), such as, for example between about 6 and about 100 including all values and increments therebetween. One or more support members 1218 having a relatively high dielectric constant ($\epsilon_r$) such as, for example between about 2,000 and about 25,000 including all values and increments therebetween, are positioned between top portion 1202*t* and bottom portion 1202*b*. In the example embodiment illustrated, a first high dielectric support member 1218*a* is positioned in the upper half of body 1202 and a second high dielectric support member 1218*b* is positioned in the lower half of body 1202. However, high dielectric support members 1218 may be positioned and spaced as desired. For example, multiple high dielectric support members 1218 may be stacked one on top of the other in the center of body 1202 along its length. High dielectric support members 1218 increase the capacitance of Z-directed capacitor 1200.

As is known in the art, the transmission line impedance through the component will increase with an increase in inductance and will decrease with an increase in capacitance. Accordingly, depending on the magnitude of the capacitance increase caused by the high dielectric layers 1218, the capacitance through conductive channel 1206 may be decreased in the high dielectric regions of body 1202 by making center conductive channel 1206 narrower as it passes through the high dielectric regions of body 1202. Making center conductive channel 1206 narrower in the high dielectric regions compensates for the increased capacitance that occurs as a result of high dielectric support members 1216. In this manner, a substantially constant impedance may be maintained through the signal path formed by center conductive channel 1206. For example, in FIG. 19, center conductive channel 1206 is illustrated in dashed lines to indicate the signal path through the component. As shown, center conductive channel 1206 narrows as it passes through first and second high dielectric support layers 1218*a*, 1218*b*. Providing low dielectric regions at the top portion 1202*t* and bottom portion 1202*b* of body 1202 prevents a disruptive impedance discontinuity as the signal travels from a trace on the PCB to a corresponding trace 1220 on body 1202 that is connected to center conductive channel 1204. Accordingly, Z-directed capacitor 1200 permits independent control of the capacitance and the transmission line impedance. While only one signal path is illustrated through Z-directed capacitor 1200, varying low and high dielectric layers 1216, 1218, respectively, may also be used with a differential signal component.

Depending on the magnitude of the capacitance increase caused by the high dielectric layers 1218, the inductance through center conductive channel 1206 may also be adjusted by altering the positions of conductive channels 1212, 1214 relative to center conductive channel 1206 in order to further maintain the constant transmission line impedance through the signal path. For example, in the high dielectric regions of body 1202, conductive channels 1212, 1214 may be moved away from center conductive channel 1206 in order to compensate for the increased capacitance that results from the high dielectric regions by increasing the inductance.

Figure 20:
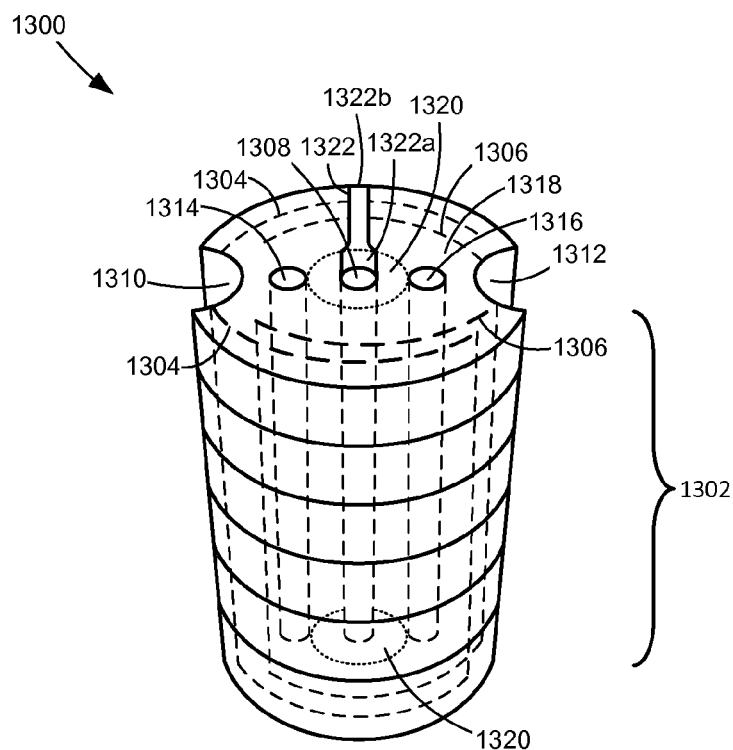
FIG. 20 is a perspective view of a Z-directed capacitor having vertically oriented conductive sheets and having a high dielectric outer region and a low dielectric inner region according to one example embodiment.

With reference to FIG. 20, a Z-directed capacitor 1300 is shown according to another example embodiment. Like Z-directed capacitor 800 shown in FIG. 15, Z-directed capacitor 1300 has a body 1302 that includes vertically oriented interleaved partial cylindrical sheets 1304, 1306, which may be arranged in a 1-1, 2-1, etc. configuration as desired. A center conductive channel 1308 extends through an interior portion of body 1302 along its length forming a signal path. Body 1302 also includes a pair of plated side channels 1310, 1312 that may be connected to a supply voltage ($V_{CC}$) and a reference voltage (GND), respectively. Cylindrical sheets 1304, 1306 are connected to side channels 1310, 1312, respectively. A dielectric material is positioned between partial cylindrical sheets 1304, 1306. A pair of conductive channels 1314, 1316 extend through the interior of body 1302 along its length next to and on opposite sides of center conductive channel 1308 in order to reduce the impedance along the signal path formed by center conductive channel 1308 as discussed above. Conductive channels 1314, 1316 may be connected to either side channel 1310 via sheet 1304 or side channel 1312 via sheet 1306 depending on the configuration desired (i.e., P-S-G, P-S-P or G-S-G).

An outer portion of body 1302 has a relatively high dielectric constant ($\in_r$), such as, for example between about 6 and about 100 including all values and increments therebetween, forming a high dielectric outer region 1318. An inner portion of body 1302 spaced inward from the side surface of body 1302 has a relatively low dielectric constant ($\in_r$) such as, for example between about 2,000 and about 25,000 including all values and increments therebetween, forming a low dielectric inner region 1320. Sheets 1304, 1306 of Z-directed capacitor 1300 run through high dielectric outer region 1318 along the length of body 1302 thereby increasing the capacitance of sheets 1304, 1306. Center conductive channel 1308 is connected to an edge of the component by a trace 1322 across a top surface 1302*t* of the component. A bottom surface 1302*b* includes a corresponding trace (not shown). Center conductive channel 1308 runs through low dielectric inner region 1320 in body 1302 along its length in order to maintain a substantially constant transmission line impedance. As a result, by providing Z-directed capacitor 1300 with a high dielectric outer region 1318 for the plates of the capacitor and low dielectric inner region 1320 for the signal path, a high capacitance and a substantially constant transmission line impedance may be achieved.

Further, the top and bottom of body 1302 where trace 1322 and the corresponding bottom trace for the signal path pass may be formed of the low dielectric constant material in order to prevent an impedance discontinuity as the signal travels from a trace on the PCB to trace 1322 or the corresponding bottom trace. Alternatively, depending on the magnitude of the capacitance increase caused by the high dielectric outer region 1318, the portions of the respective traces traveling over high dielectric outer region 1318 may be narrowed in order to decrease the capacitance therethrough. For example, as shown in FIG. 20, trace 1322 includes a wider portion 1322*a* that travels across lower dielectric inner region 1320 and a narrower portion 1322*b* that travels across higher dielectric outer region 1318. The varied width of trace 1322 compensates for the increased capacitance that results from high dielectric outer region 1318 to help maintain a substantially constant impedance therethrough. Further, the width of center conductive channel 1308 is substantially the same as wider portion 1322*a* of trace 1322 in order to maintain a constant impedance through the component. Again, while only one signal path is illustrated through Z-directed capacitor 1300, a differential signal component may also be formed having a low dielectric inner region 1320 and a high dielectric outer region 1318.

Figure 21:
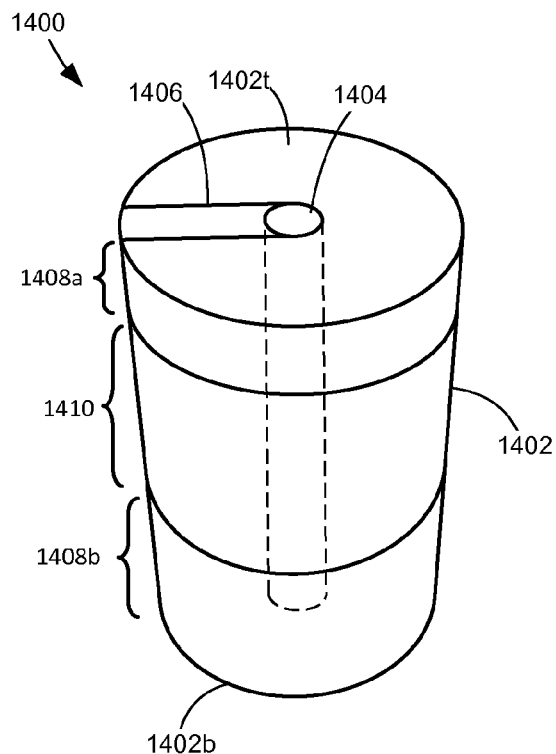
FIG. 21 is a perspective view of a Z-directed delay line component according to one example embodiment.

While Z-directed capacitors are illustrated in FIGS. 19 and 20, other Z-directed components may benefit from having varying dielectric regions. For example, FIG. 21 shows a Z-directed delay line component 1400 having a body 1402 that includes a conductive delay line 1404 therein forming a signal path. Body 1402 includes a trace 1406 that runs across its top surface 1402*t* and connects delay line 1404 to an edge of the component. Bottom surface 1402*b* of body 1402 includes a similar trace (not shown) that connects the other end of delay line 1404 to the edge of the component. Body 1402 also includes a relatively low dielectric region 1408 and a relatively high dielectric region 1410. In the example embodiment illustrated, high dielectric region 1410 is positioned in a center portion of body 1402 along its length while low dielectric region 1408 is split into two halves 1408*a*, 1408*b* positioned at the top and bottom portion, respectively, of body 1402 along its length. However, the size and placement of each dielectric region may be optimized to achieve the desired delay. Further, the number of different dielectric regions as well as their respective dielectric properties may also be optimized to achieve the desired delay. As a signal travels through component 1400 on delay line 1404, it will be slowed as it passes through the high dielectric region 1410. The signal may be further delayed by altering its path through the component, such as by providing a zigzag or spiral pattern. While the example embodiment illustrated shows the signal entering the component from one end and leaving from the other, it will be appreciated that the signal may enter and leave at the same end or it may enter and/or leave along a side surface of the component, for example by providing a plated side channel as discussed above.

Reduction of the Net Loop Area of the Z-Directed Component

Figure 22:
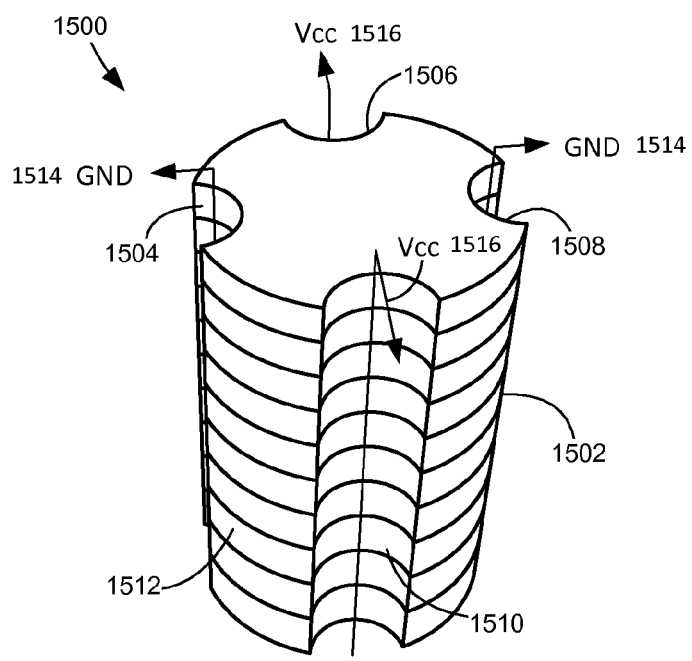
FIG. 22 is a perspective view of a Z-directed capacitor that includes four plated side channels according to one example embodiment.

FIG. 22 shows a Z-directed capacitor 1500 having a body 1502 that includes four plated side channels 1504, 1506, 1508, 1510. Side channels 1504, 1506, 1508, 1510 are spaced substantially equally (about 90 degrees) from each other around the edge of the component. Body 1502 is comprised of stacked layers or support members 1512. Each support member 1512 is composed of dielectric material and is plated with conductive material to form the plates of the capacitor as discussed above. In one embodiment, side channels 1504 and 1508 are connected to a reference voltage (GND) 1514 and side channels 1506, 1510 are connected to a voltage supply ($V_{CC}$ 1516).

Figure 23:
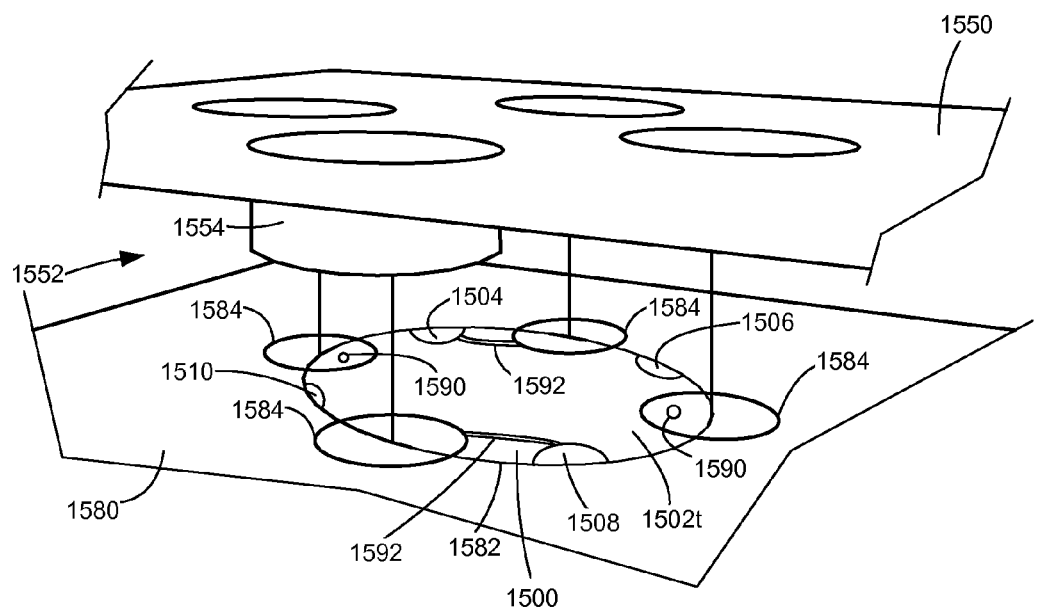
FIG. 23 is a perspective view of the Z-directed capacitor shown in FIG. 22 mounted in a PCB and connected to a ball grid array of an integrated circuit.

As illustrated in FIG. 23, one application of Z-directed capacitor 1500 is as a zero lead-length decoupling capacitor under an integrated circuit (IC) 1550 utilizing a ball grid array (BGA) (or a micro-BGA) 1552 having conductive balls 1554. For clarity, only one ball 1554 is shown in FIG. 23. In this embodiment, a conductive (e.g., copper) ball pad 1584 is electrically connected to each plated side channel 1504, 1506, 1508, 1510. In one embodiment, each ball pad 1584 is positioned on top of and connected to a conductive channel 1590 through an interior portion of the component. Conductive channels 1590 are connected to a respective side channel 1504, 1506, 1508, 1510 on an internal layer of Z-directed capacitor 1500. Alternatively, ball pads 1584 may be connected to side channels 1504, 1506, 1508, 1510 by a trace 1592 across the top surface 1502*t* of Z-directed capacitor 1500. Further, ball pads 1584 may be positioned directly on top of and connected to plated side channels 1504, 1506, 1508, 1510; however, in this configuration, there is a risk that the conductive material of balls 1554 will be pulled into side channels 1504, 1506, 1508, 1510 potentially disrupting the electrical connection between the ball 1554 and IC 1550. The conductive balls 1554 of the BGA 1552 are placed on top of ball pads 1584 when the integrated circuit 1550 is installed on PCB 1580. As discussed in greater detail below, wire bonds connect the balls 1554 to the substrate of IC 1550. This geometry creates a loop that follows the path between side channels 1506, 1510 connected to $V_{CC}$ 1516 and side channels 1504, 1508 connected to GND 1514 through Z-directed capacitor 1500, balls 1554 and IC 1550.

Figure 24:
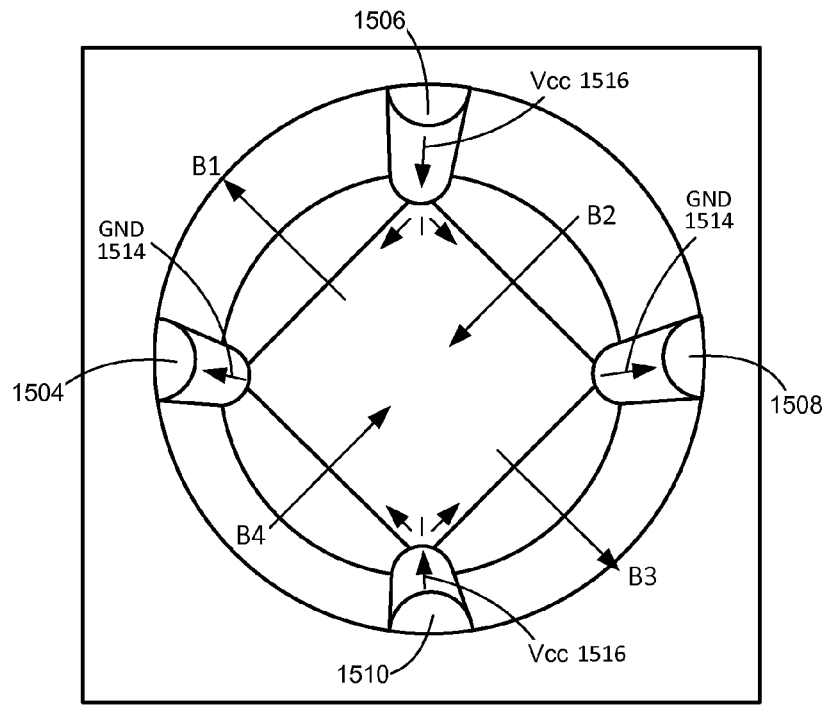
FIG. 24 is a schematic depiction of the current and magnetic elements of the Z-directed capacitor shown in FIGS. 22 and 23.

FIG. 24 illustrates a schematic depiction of the various currents (labeled "I") and magnetic fluxes (labeled "B") of the loop. The currents (I) having direction vectors moving from $V_{CC}$ 1516 to GND 1514 create respective magnetic fluxes (B). As shown in FIG. 24, by providing four equally spaced conductive side channels 1504, 1506, 1508, 1510 with GND 1514 passing through opposite channels 1504, 1508 and $V_{CC}$ 1516 passing through the other opposite channels 1506, 1510, the direction of the magnetic flux vector (B) of each loop is opposite that of the magnetic flux vector (B) on the opposite side. For example, magnetic flux vector B1 and magnetic flux vector B3, positioned on opposite sides of Z-directed capacitor 1500, have opposite directions. Similarly, the directions of magnetic flux vector B2 and magnetic flux vector B4 are also opposite one another. As a result, the net magnetic flux (and net loop area) of Z-directed capacitor 1500 is significantly reduced thereby also reducing the inductance of the component. This aids in preventing unwanted voltage drops and reduces the radiated electromagnetic emissions from the component. Although Z-directed capacitor 1500 is illustrated as having four equally spaced side channels 1504, 1506, 1508, 1510, it will be appreciated that net magnetic flux cancellation may also be achieved using four equally spaced conductive channels through an interior portion of the component, such as by providing four conductive channels that are positioned near the edge of the component and spaced apart by 90 degrees.

FIGS. 25A and 25B show a first support member 1512*a* and a second support member 1512*b* of Z-directed capacitor 1500, respectively, in closer detail. FIGS. 25A and 25B show side channels 1504, 1506, 1508, 1510 plated with conductive material. As shown in FIG. 25A, side channels 1504 and 1508 connected to GND 1514 are connected to each other across the top surface of first support member 1512*a* via annular plating 1518. In contrast, side channels 1506 and 1510 connected to $V_{CC}$ 1516 are each spaced from annular plating 1518 on first support member 1512*a*. As shown in FIG. 25B, side channels 1506 and 1510 connected to $V_{CC}$ 1516 are connected to each other across the top surface of second support member 1512*b* via annular plating 1518. Side channels 1504 and 1508 connected to GND 1514 are each spaced from annular plating 1518 on second support member 1512*b*. As discussed above, support members 1512*a* and 1512*b* may alternate to form any pattern desired, such as 1-1, 2-1, 2-2, 3-1, etc.

FIGS. 25C and 25D show alternative support members 1512*c* and 1512*d* for use where it is desired to decouple more than two voltages in Z-directed capacitor 1500. As shown in FIG. 25C, side channel 1504 is connected to a first voltage V1 and side channel 1508 is connected to a second voltage V2 on support member 1512*c*. Annular plating 1518 extends from each of side channels 1504 and 1508 and covers a majority of the top surface of support member 1512*c*. However, the plating 1518 connected to side channel 1504 does not contact the plating 1518 connected to side channel 1508. Further, plating 1518 on support member 1512*c* is spaced from side channels 1506 and 1510. As shown in FIG. 25D, side channel 1506 is connected to a third voltage V3 and side channel 1510 is connected to a fourth voltage V4 on support member 1512*d*. Annular plating 1518 extends from each of side channels 1506 and 1510 and covers a majority of the top surface of support member 1512*d*. Again, the plating 1518 connected to side channel 1506 does not contact the plating 1518 connected to side channel 1510. Further, plating 1518 on support member 1512*d* is spaced from side channels 1504 and 1508. By alternating support members 1512*c* and 1512*d*, a Z-directed capacitor may be formed that can couple four different voltages together. Voltages V1, V2, V3 and V4 may be any voltage desired; for example, one may be a reference voltage and the others supply voltages referenced thereto.

Combinations of these support members 1512*a*, 1512*b*, 1512*c*, 1512*d* may also be used as desired. For example, where one pair of voltages is shorted together but the other is not, such as for a system with a common ground and two power supplies (e.g., a positive voltage supply and a negative voltage supply with respect to ground), Z-directed capacitor 1500 may be formed by alternating support member 1512*a* with support member 1512*d* or by alternating support member 1512*b* with support member 1512*c*.

It will be appreciated that support members 1512*c* and 1512*d* provide less field cancellation than support members 1512*a* and 1512*b*; however, support members 1512*c* and 1512*d* may reduce the number of components needed to form the desired circuit by providing the ability to decouple more voltages using a single Z-directed capacitor. For example, where IC 1550 requires 2 voltages to be decoupled, such as a core voltage and an input/output (I/O) voltage, Z-directed capacitor 1500 formed by alternating support members 1512*a* and 1512*d* or support members 1512*b* and 1512*c* may be placed on PCB 1580 and connected to the core voltage and the I/O voltage as well as their respective reference voltages.

This greatly reduces the loop area in comparison with conventional decoupling methods, which typically use a pair of surface mounted capacitors, one for each of the core voltage and the I/O voltage, connected to the IC by traces across the surface of the PCB.

Figure 26A:
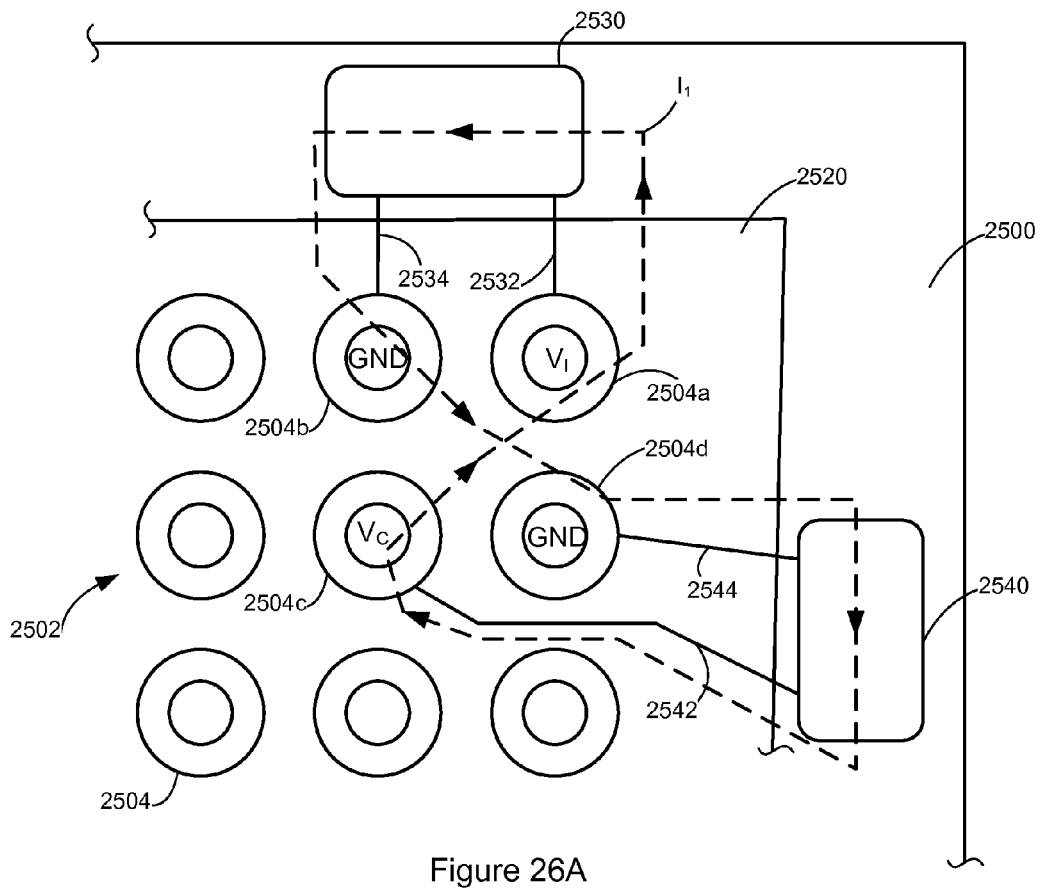
FIG. 26A is a top schematic view of a prior art integrated circuit mounted on a PCB via a ball grid array and connected to a pair of surface mounted capacitors.
Figure 26B:
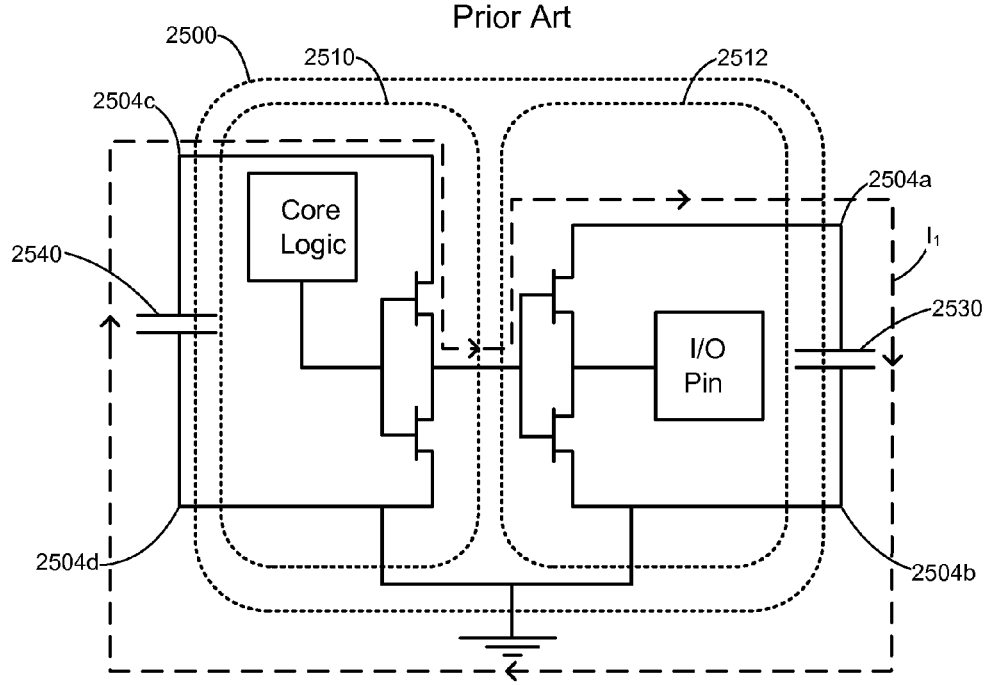
FIG. 26B is a schematic diagram of the integrated circuit shown in FIG. 26A.

For example, FIGS. 26A and 26B show a top schematic view and a schematic diagram, respectively, of a portion of a prior art IC 2500 having a BGA 2502 made up of conductive balls 2504 mounted on corresponding conductive ball pads (not shown beneath balls 2504) of a PCB 2520. IC 2500 includes a core region 2510 and an I/O region 2512 which each contain many logic gates as is known in the art. A pair of conventional surface mounted capacitors 2530, 2540 are mounted on PCB 2520 and connected to I/O region 2512 and core region 2510, respectively. Specifically, capacitor 2530 is connected to the supply voltage $V_I$ of I/O region 2512 by a trace 2532 across the surface of PCB 2520 to ball 2504a and to ground voltage GND by a trace 2534 to ball 2504b. Capacitor 2540 is connected to a supply voltage $V_c$ of core region 2510 by a trace 2542 to ball 2504c and to ground GND by a trace 2544 to ball 2504d. The current loop ($I_1$) formed between capacitors 2530, 2540, core region 2510 and I/O region 2512 is shown in dashed lines in FIGS. 26A and 26B.

Figure 27A:
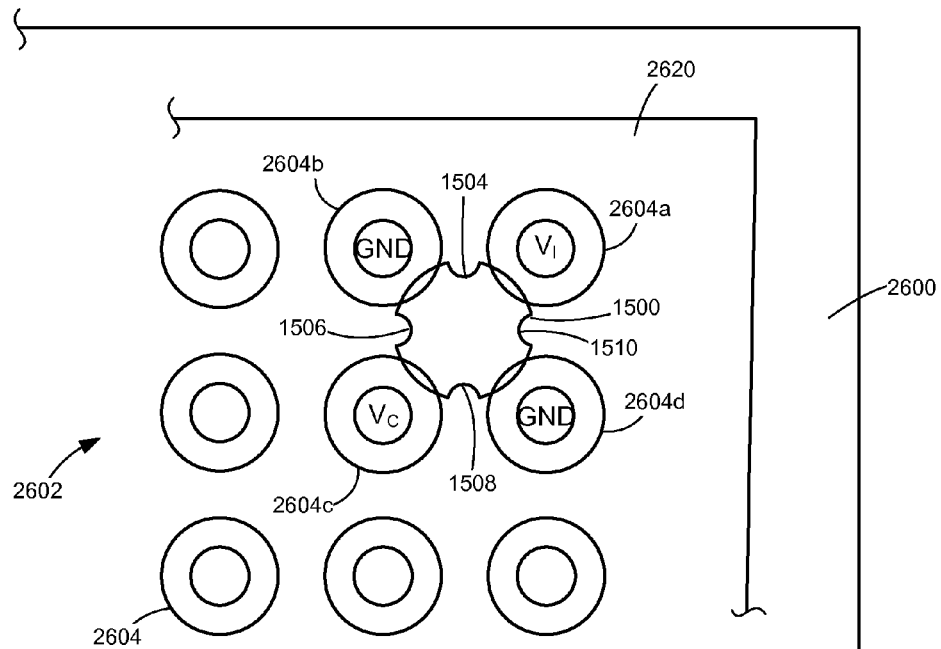
FIG. 27A is a top schematic view of an integrated circuit mounted on a PCB via a ball grid array and connected to a Z-directed capacitor according to one example embodiment.
Figure 27B:
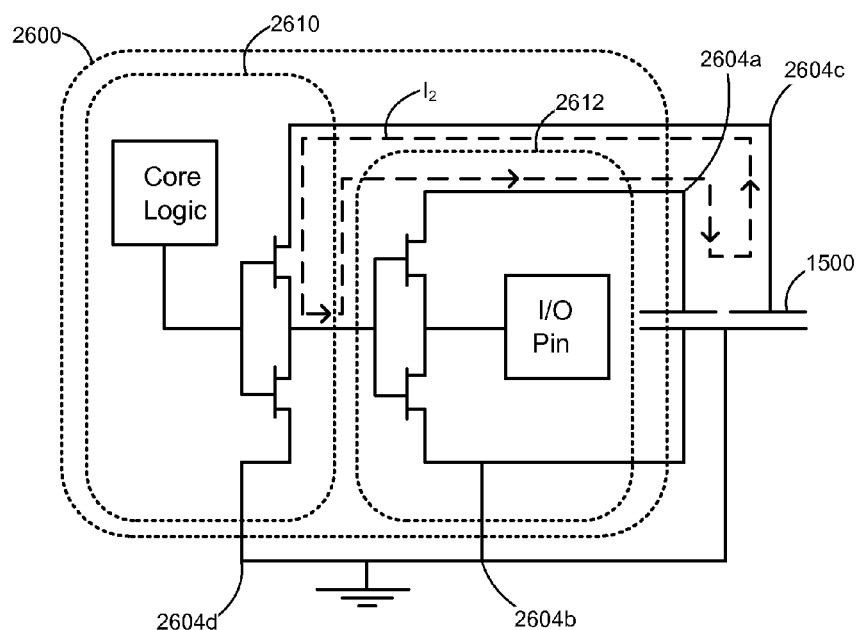
FIG. 27B is a schematic diagram of the integrated circuit shown in FIG. 27A.

FIGS. 27A and 27B show a top schematic view and a schematic diagram, respectively, of a portion of IC 2600 having a BGA 2602 of conductive balls 2604 mounted on corresponding conductive ball pads (not shown beneath balls 2604) of a PCB 2620. Like prior art IC 2500, IC 2600 includes a core region 2610 and an I/O region 2612 which each contain logic gates. In the example embodiment shown in FIGS. 27A and 27B, surface mounted capacitors 2530, 2540 have been replaced with a single Z-directed capacitor, such as Z-directed capacitor 1500, mounted in a mounting hole in PCB 2620 and connected to both core region 2610 and I/O region 2612. Specifically, side channel 1504 of Z-directed capacitor 1500 is connected to the supply voltage $V_I$ of I/O region 2612 by ball 2604a, side channel 1508 is connected to a supply voltage $V_c$ of core region 2610 by ball 2604c and side channels 1506, 1510 are connected to ground voltage GND by ball 2604b, 2604d. The current loop ($I_2$) formed between Z-directed capacitor 1500, core region 2610 and I/O region 2612 is shown in dashed lines in FIGS. 27A and 27B. As shown, the loop area of current path $I_2$ utilizing Z-directed capacitor 1500 is significantly reduced in comparison with the loop area of current path $I_1$ utilizing conventional surface mount capacitors 2530, 2540. Further, Z-directed capacitor 1500 positioned directly beneath IC 2600 occupies significantly less space on PCB 2620 than surface mount capacitors 2530, 2540 which are spaced from IC 2500 and connected to IC 2500 via traces on PCB 2520.

Figure 28:
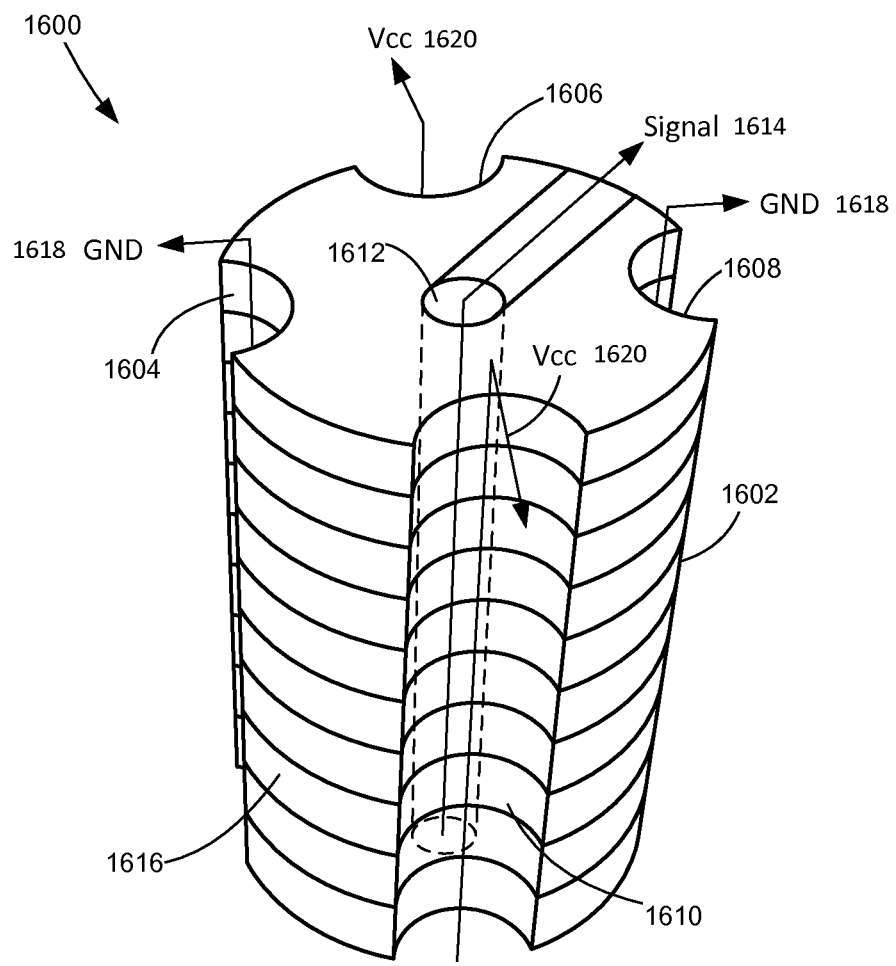
FIG. 28 is a perspective view of a Z-directed capacitor that includes four plated side channels and a center conductive channel according to one example embodiment.

FIG. 28 shows a Z-directed capacitor 1600 having a body 1602 that, like Z-directed capacitor 1500, includes four plated side channels 1604, 1606, 1608, 1610. Side channels 1604, 1606, 1608, 1610 are spaced substantially equally (about 90 degrees) from each other around the edge of the component. Z-directed capacitor also includes a center conductive channel 1612 for passing a signal 1614 through the component. Body 1602 is comprised of stacked layers or support members 1616. Each support member 1616 is composed of dielectric material and is plated with conductive material to form the plates of the capacitor as discussed above. In one embodiment, side channels 1604 and 1608 are connected to a reference voltage (GND) 1618 and side channels 1606, 1610 are connected to a voltage supply ($V_{CC}$) 1620. As discussed above, spacing plated side channels 1604, 1606, 1608, 1610 equally around the edge of the component reduces the net magnetic flux of Z-directed capacitor 1600.

FIGS. 29A and 29B show a first support member 1616a and a second support member 1616b of Z-directed capacitor 1600, respectively, in closer detail. FIGS. 29A and 29B show side channels 1604, 1606, 1608, 1610 and center channel 1612 plated with conductive material. As shown in FIG. 29A, side channels 1604 and 1608 connected to GND 1618 are connected to each other across the top surface of first support member 1616a via annular plating 1622. In contrast, side channels 1606 and 1610 connected to $V_{CC}$ 1620 are each spaced from annular plating 1622 on first support member 1616a. As shown in FIG. 29B, side channels 1606 and 1610 connected to $V_{CC}$ 1620 are connected to each other across the top surface of second support member 1616b via annular plating 1622. Side channels 1604 and 1608 connected to GND 1618 are each spaced from annular plating 1622 on second support member 1616b. As shown in FIG. 29A and FIG. 29B, center conductive channel 1612 is spaced from annular plating 1622 on support member 1616a and support member 1616b. As discussed above, support members 1616a and 1616b may alternate to form any pattern desired, such as 1-1, 2-1, 2-2, 3-1, etc.

FIGS. 29C and 29D show alternative support members 1616c and 1616d for use where it is desired to decouple more than two voltages in Z-directed capacitor 1600 as discussed above. As shown in FIG. 29C, side channel 1604 is connected to a first voltage V1 and side channel 1608 is connected to a second voltage V2 on support member 1616c. Annular plating 1622 extends from each of side channels 1604 and 1608 and covers a majority of the top surface of support member 1616c. However, the plating 1622 connected to side channel 1604 does not contact the plating 1622 connected to side channel 1608. Further, plating 1622 on support member 1616c is spaced from side channels 1606 and 1610. As shown in FIG. 29D, side channel 1606 is connected to a third voltage V3 and side channel 1610 is connected to a fourth voltage V4 on support member 1616d. Annular plating 1622 extends from each of side channels 1606 and 1610 and covers a majority of the top surface of support member 1616d. Again, the plating 1622 connected to side channel 1606 does not contact the plating 1622 connected to side channel 1610. Further, plating 1622 on support member 1616d is spaced from side channels 1604 and 1608. As shown in FIG. 29C and FIG. 29D, center conductive channel 1612 is spaced from annular plating 1622 on support member 1616c and support member 1616d.

As discussed above, various combinations of these support members 1616a, 1616b, 1616c, 1616d may be used as desired, such as to decouple a core voltage and an input/output (I/O) voltage of an integrated circuit. Although Z-directed capacitor 1600 is depicted as having only one signal path 1614, additional conductive channels may be provided to accommodate a differential signal. Further, a pair of additional conductive channels may be positioned next to and on opposite sides of center conductive channel 1612 in order to reduce the transmission line impedance through the component as discussed above with respect to FIGS. 13-18.

Ball Grid Array Placement with PCBs Using a Z-Directed Component

In conventional BGA (and micro-BGA) configurations, there is typically only room for one PCB via in the middle of a group of four ball pads. A ball pad may be placed on a PCB via; however, in some instances, the board via may pull the conductive material of the ball into the via reducing the ball size and creating yield issues. It is possible to fill the via in advance in order to avoid this issue but additional processing steps are required. In contrast, the Z-directed components described herein do not possess holes that would pull the conductive material of the ball. Rather, the Z-directed components are mounted in a hole in the PCB and may include interior conductive channels and/or conductive side channels that are exposed on a top surface of the component. A conductive ball pad may be connected to the exposed conductive channels making the Z-directed components compatible with a BGA process.

Figure 30:
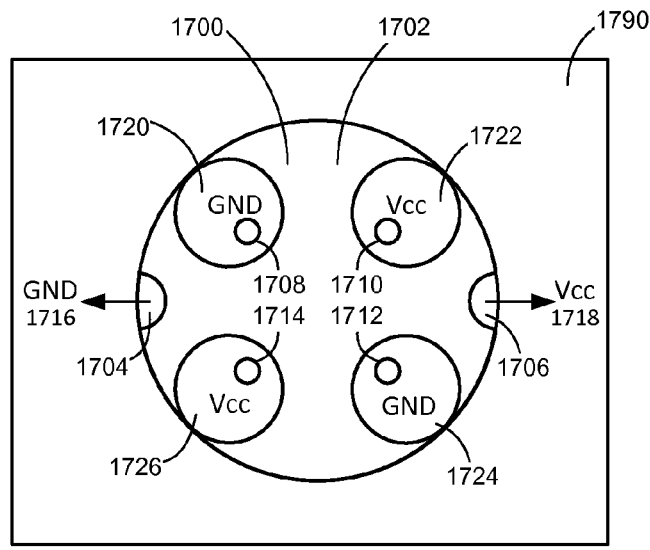
FIG. 30 is a plan view of a top surface of a Z-directed component mounted in a PCB and connected to four conductive ball pads according to one example embodiment.

The Z-directed components can accommodate a variety of configurations to improve the decoupling of a BGA integrated circuit. For example, FIG. 30 shows a top surface 1702 of a Z-directed component 1700 mounted in a PCB 1790 that includes a pair of conductive side channels 1704, 1706 on opposite sides of the component and four equally spaced conductive channels 1708, 1710, 1712, 1714 through an interior portion of the component. In the example embodiment illustrated, side channel 1704 is connected to a reference voltage (GND) 1716 and side channel 1706 is connected to a voltage supply ($V_{CC}$) 1718. This connection may be established on an interior layer of PCB 1790. In the example embodiment shown, side channels 1704, 1706 are positioned to effectively form board vias that provide the connections to GND 1716 and $V_{CC}$ 1718. Conductive channels 1708 and 1712 are connected to GND 1716 such as by connecting side channel 1704 to conductive channels 1708, 1712 on an internal layer of the component as discussed above. Conductive channels 1710 and 1714 are connected to $V_{CC}$ 1718 by similar means. Conductive ball pads 1720, 1722, 1724, 1726 are connected to conductive channels 1708, 1710, 1712, 1714, respectively, to receive corresponding balls (not shown) of the BGA. In this embodiment, each ball pad 1720, 1722, 1724, 1726 is positioned on the surface of Z-directed component 1700, which is inserted into a mounting hole in PCB 1790 so that ball pads 1720, 1722, 1724, 1726 are flush with the other ball pads of PCB 1790. Further, as discussed above with respect to FIG. 24, the relative positioning of conductive channels 1708, 1712 connected to GND 1716 and conductive channels 1710, 1714 connected to $V_{CC}$ 1718 provides magnetic flux cancellation to reduce the electromagnetic emissions of Z-directed component 1700.

Figure 31:
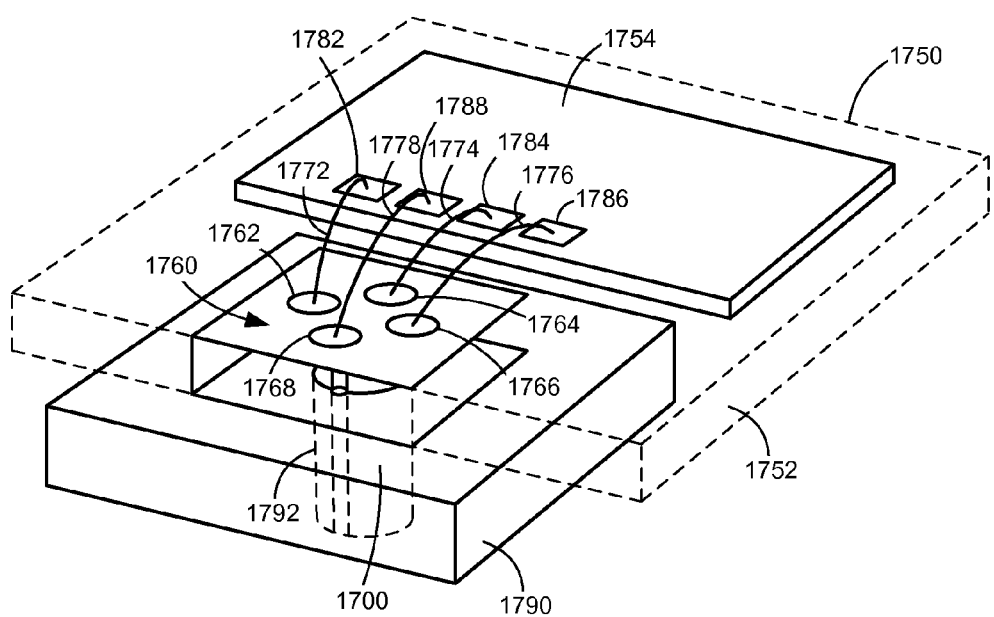
FIG. 31 is a perspective view of the Z-directed component shown in FIG. 28 connected to a ball grid array of an integrated circuit according to one example embodiment.

FIG. 31 shows Z-directed component 1700 mounted in a mounting hole 1792 of a PCB 1790. An integrated circuit 1750 is mounted on PCB 1790 using a ball grid array 1760. As is known in the art, IC 1750 may be operatively connected to BGA 1760 within a common package 1752 (schematically shown in dashed lines). Conductive channels 1708, 1710, 1712, 1714 are connected to corresponding balls 1762, 1764, 1766, 1768, respectively, of BGA 1760. The locations of balls 1762, 1764, 1766, 1768 are shown as circles on a top side of BGA 1760. Balls 1762, 1764, 1766, 1768 are connected to a substrate 1754 of IC 1750 by wire bonds 1772, 1774, 1776, 1778, respectively, within package 1752. Specifically, wire bonds 1772, 1774, 1776, 1778 connect balls 1762, 1764, 1766, 1768 to corresponding contacts 1782, 1784, 1786, 1788, respectively, on substrate 1754. Accordingly, contacts 1782 and 1786 are connected to GND 1716 while contacts 1784 and 1788 are connected to $V_{CC}$ 1718. Contact 1782 connected to GND 1716 is positioned next to contact 1788 connected to $V_{CC}$ 1718. Similarly, contact 1784 connected to $V_{CC}$ 1718 is positioned next to contact 1786 connected to GND 1716. This permits the magnetic flux reduction achieved by Z-directed component 1700 to extend from the component through wire bonds 1772, 1774, 1776, 1778 into IC 1750. In the example embodiment illustrated, contacts 1782, 1784, 1786, 1788 form a power-ground-ground-power configuration. Alternatively, a ground-power-power-ground configuration may also be used as desired. In this manner, the magnetic flux of one power-ground pair will tend to cancel with the other pair thereby reducing the inductance and electromagnetic emissions from Z-directed component 1700 through ball pads 1720, 1722, 1724, 1726, balls 1762, 1764, 1766, 1768, and wire bonds 1772, 1774, 1776, 1778.

Figure 32A:
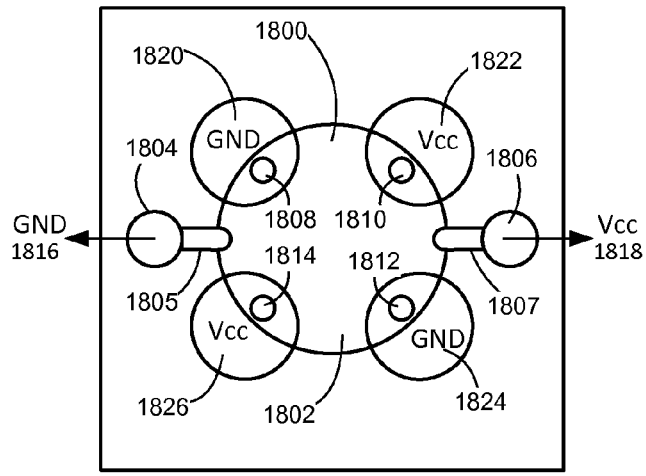
FIGS. 32A-E are plan views of various example embodiments of Z-directed components connected to conductive ball pads for connecting to a ball grid array.

FIG. 32A shows a Z-directed component 1800 similar to Z-directed component 1700 except that Z-directed component 1800 is not large enough for the ball pads to be completely positioned on the component. Z-directed component 1800 includes four equally spaced conductive channels 1808, 1810, 1812, 1814 through an interior portion of the component. Z-directed component 1800 does not require side channels but may instead connect to PCB vias 1804, 1806 by respective board traces 1805, 1807 to establish connections with GND 1816 and $V_{CC}$ 1818. GND 1816 and $V_{CC}$ 1818 may then be connected to conductive channels 1808, 1812 and conductive channels 1810, 1814, respectively, via corresponding traces (not shown) on the top surface, bottom surface or an internal layer of Z-directed component 1800 depending on whether board traces 1805, 1807 are positioned on the top or bottom surface of the PCB or an internal layer. Conductive ball pads 1820, 1822, 1824, 1826 are connected to conductive channels 1808, 1810, 1812, 1814, respectively. In this embodiment, each ball pad 1820, 1822, 1824, 1826 is shared between a top surface 1802 of the Z-directed component 1800 and the top surface of the PCB. Although Z-directed component is illustrated as having four equally spaced interior conductive channels 1808, 1810, 1812, 1814, it will be appreciated that conductive side channels may be used as well. In this alternative, each ball pads 1820, 1822, 1824, 1826 is positioned on a respective side channel.

Figure 32B:
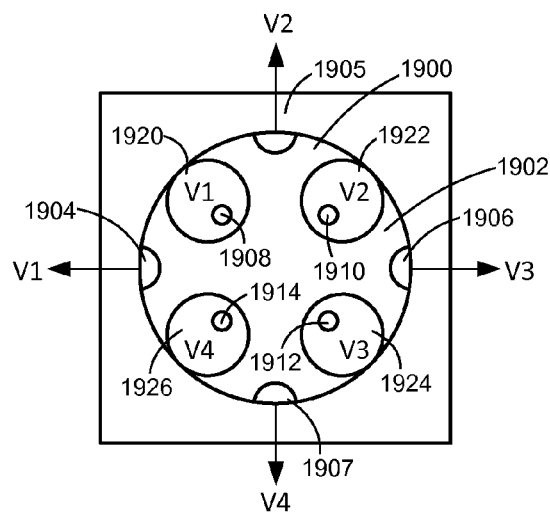

FIG. 32B illustrates an additional example Z-directed component 1900 similar to Z-directed component 1700 except that Z-directed component 1900 may accommodate four distinct voltages with four ball pads. Z-directed component 1900 includes four conductive side channels 1904, 1905, 1906, 1907 spaced equally around the edge of the component. Z-directed component 1900 further includes four equally spaced conductive channels 1908, 1910, 1912, 1914 through an interior portion of the component. In the example embodiment illustrated, side channels 1904, 1905, 1906, 1907 are connected to a first voltage (V1), a second voltage (V2), a third voltage (V3) and a fourth voltage (V4), respectively. Each of side channels 1904, 1905, 1906, 1907 are also connected to a respective conductive channel 1908, 1910, 1912, 1914. Conductive ball pads 1920, 1922, 1924, 1926 are positioned on a top surface 1902 of component 1900 on conductive channels 1908, 1910, 1912, 1914, respectively. In this embodiment, Z-directed component 1900 may be connected to up to four distinct voltages. Alternatively, one or more of voltages V1 through V4 may be the same. For example, V1 may be the same as V3 and/or V2 may be the same as V4. In one embodiment, V1 and V3 are a common reference voltage and V2 and V4 are a common voltage supply. In another embodiment, V1 and V3 are a common reference voltage, V2 is a positive voltage supply and V4 is a negative voltage supply relative to the reference voltage.

Figure 32C:
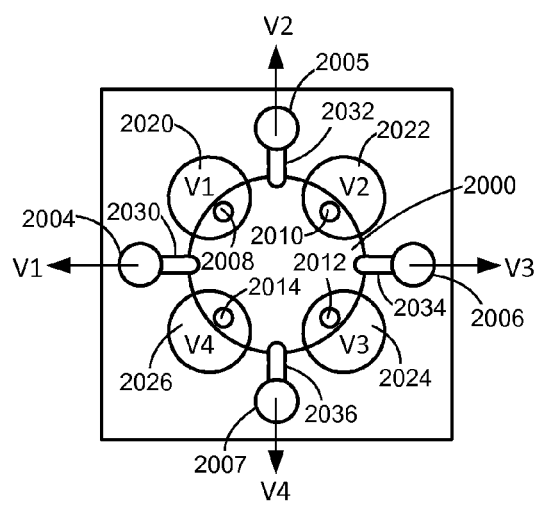

FIG. 32C shows a Z-directed component 2000 similar to Z-directed component 1900 except that Z-directed component 2000 is not large enough for the ball pads to be completely positioned on the component. Z-directed component 2000 includes four equally spaced conductive channels 2008, 2010, 2012, 2014 through an interior portion of the component; however, conductive side channels may be used instead. Z-directed component 2000 does not include side channels but instead connects to PCB vias 2004, 2005, 2006, 2007 via respective board traces 2030, 2032, 2034, 2036 to establish the connections with voltages V1 through V4 as discussed above. Conductive ball pads 2020, 2022, 2024, 2026 are connected to conductive channels 2008, 2010, 2012, 2014, respectively, such that each ball pad 2020, 2022, 2024, 2026 overlaps between Z-directed component 2000 and the PCB.

Figure 32D:
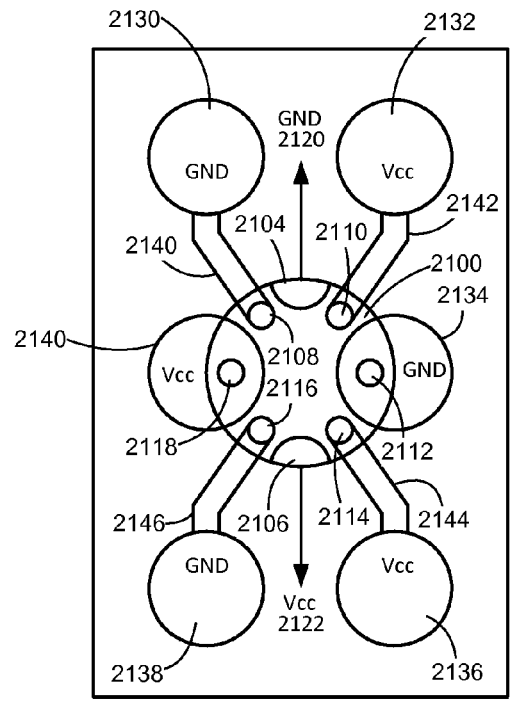

FIG. 32D illustrates another example Z-directed component 2100 that includes connections to six ball pads. Z-directed component 2100 includes a pair of conductive side channels 2104, 2106 on opposite sides of the component. Z-directed component 2100 further includes six equally spaced conductive channels 2108, 2110, 2112, 2114, 2116, 2118 through an interior portion of the component; however, side channels may also be used. In the example embodiment illustrated, side channels 2104, 2106 are connected to GND 2120 and $V_{CC}$ 2122, respectively. In this embodiment, side channels 2104, 2106 are positioned to effectively form board vias that form the connections to GND 2120 and $V_{CC}$ 2122. Conductive channels 2108, 2112, 2116 are connected to GND 2120 and conductive channels 2110, 2114, 2118 are connected to $V_{CC}$ 2122. Six conductive ball pads 2130, 2132, 2134, 2136, 2138, 2140 are connected to Z-directed component 2100 to receive corresponding balls (not shown) of the BGA. Specifically, ball pads 2130, 2132, 2136, 2138 are positioned on the PCB and are spaced from Z-directed component 2100. Ball pads 2130, 2132, 2136, 2138 are connected to conductive channels 2108, 2110, 2114, 2116, respectively, by corresponding traces 2140, 2142, 2144, 2146 across the PCB and Z-directed component 2100. Ball pads 2134, 2140 are shared by the PCB and Z-directed component 2100 and are connected directly to conductive channels 2112, 2118, respectively.

Figure 32E:
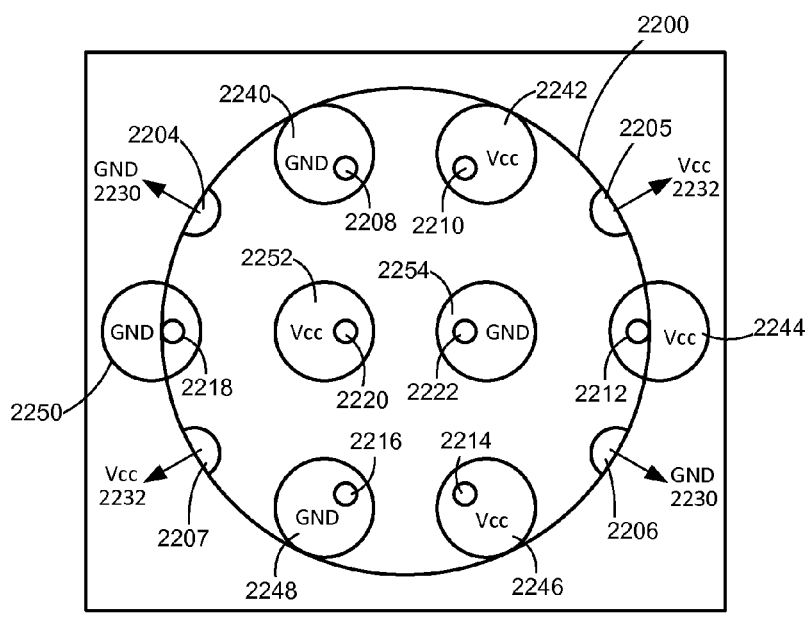

FIG. 32E illustrates yet another example embodiment of a Z-directed component 2200 that includes connections to eight ball pads. Z-directed component 2200 includes four conductive side channels 2204, 2205, 2206, 2207 equally spaced around the edge of the component. Z-directed component 2200 further includes a total of eight spaced conductive channels 2208, 2210, 2212, 2214, 2216, 2218, 2220, 2222 through an interior portion of the component; however, side channels may also be used in place of the interior channels located near the edge of the component. In the example embodiment illustrated, side channels 2204, 2206 are connected to GND 2230 and side channels 2205, 2207 are connected to $V_{CC}$ 2232. Conductive channels 2208, 2216, 2218, 2222 are connected to GND 2230 and conductive channels 2210, 2212, 2214, 2220 are connected to $V_{CC}$ 2232. Eight conductive ball pads 2240, 2242, 2244, 2246, 2248, 2250, 2252, 2254 are connected to Z-directed component 2200 to receive corresponding balls (not shown) of the BGA. Specifically, ball pads 2240, 2242, 2244, 2246, 2248, 2250, 2252, 2254 are positioned on and connected to conductive channels 2208, 2210, 2212, 2214, 2216, 2218, 2220, 2222, respectively.

FIGS. 30 and 32A through 32E are not intended to be limiting and are instead intended to illustrate the flexibility available in utilizing a Z-directed component with a BGA. As discussed above, any number of connections may be made between a Z-directed component and a BGA depending on the sizes of the Z-directed component and the BGA. Further, connections between a Z-directed component and a BGA ball may be made using a ball pad positioned on the Z-directed component, a ball pad shared by the Z-directed component and the board, or by connecting a ball pad on the board to the Z-directed component using a surface trace or internal connection. The Z-directed component may be connected to the desired voltages by any suitable connection, such as by using a trace on a top, bottom or intermediate layer of the board or by providing a connection to a conductive side channel of the Z-directed component.

It will be appreciated that the Z-directed components may also be connected to an integrated circuit using a flip chip bonding method. In this method, conductive pads are positioned on the surface of the integrated circuit substrate. Solder dots are then deposited on each of the pads. The integrated circuit substrate is then flipped and positioned to face and mate with corresponding contacts on the surface of the PCB. The conductive channels (either side or interior) exposed on the top or bottom surface of a Z-directed component may comprise a portion of these contacts on the PCB. After the solder dots are mated with the PCB and/or the Z-directed component(s), the solder is melted, such as by applying a hot air reflow. The mounted chip is then underfilled typically using an electrically insulating adhesive to complete the bond. Further, the Z-directed components may also be directly or indirectly connected to one or more power pins of an integrated circuit.

Figure 33A:
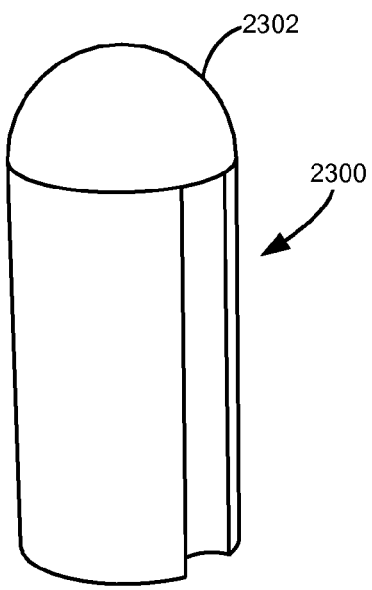
FIG. 33A is a perspective view of a Z-directed component having a dome formed on an end thereof according to one example embodiment.
Figure 33B:
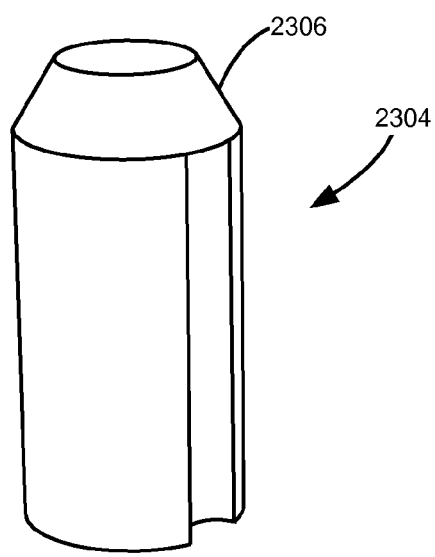
FIG. 33B is a perspective view of a Z-directed component having a chamfered end according to one example embodiment.

In some embodiments, a chamfer, dome or other form of taper or lead-in of at least one of the top and bottom surface of the Z-directed component is desired in order to ease insertion of the Z-directed component into the mounting hole in the PCB. For example, FIG. 33A shows a Z-directed component 2300 having a dome 2302 formed on an end thereof FIG. 33B shows a Z-directed component 2304 having a chamfered end 2306. The dome 2302 or chamfer 2306 may be part of the component or attached thereto. In one embodiment, the dome 2302 or chamfer 2306 is a separate part that is partially inserted into the mounting hole in the PCB. In this embodiment, the Z-directed component is then inserted behind the dome 2302 or chamfer 2306 to push it through the mounting hole causing the dome 2302 or chamfer 2306 to expand the mounting hole and prevent the component from cutting or tearing the PCB. Where the dome 2302 or chamfer 2306 is attached to the Z-directed component, it may be configured to remain attached to the Z-directed component following insertion into the mounting hole in the PCB or it may be used to facilitate insertion and then removed.

Figure 34A:
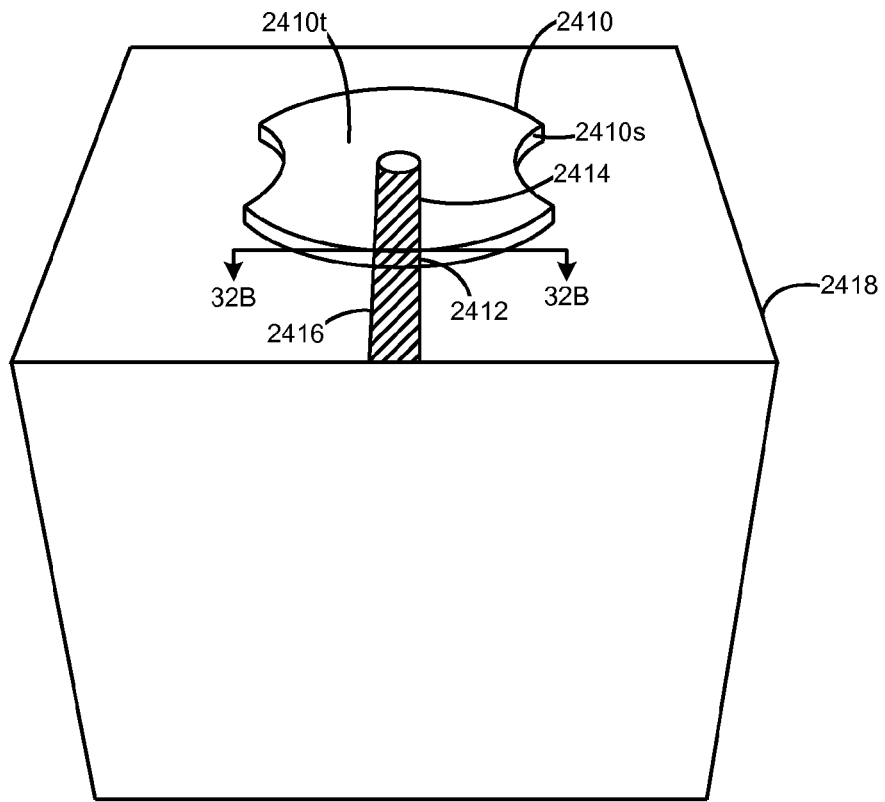
FIG. 34A is a perspective view of a Z-directed component inserted into a mounting hole in a PCB, the Z-directed component having a conductive strip applied to a side surface thereof according to one example embodiment.
Figure 34B:
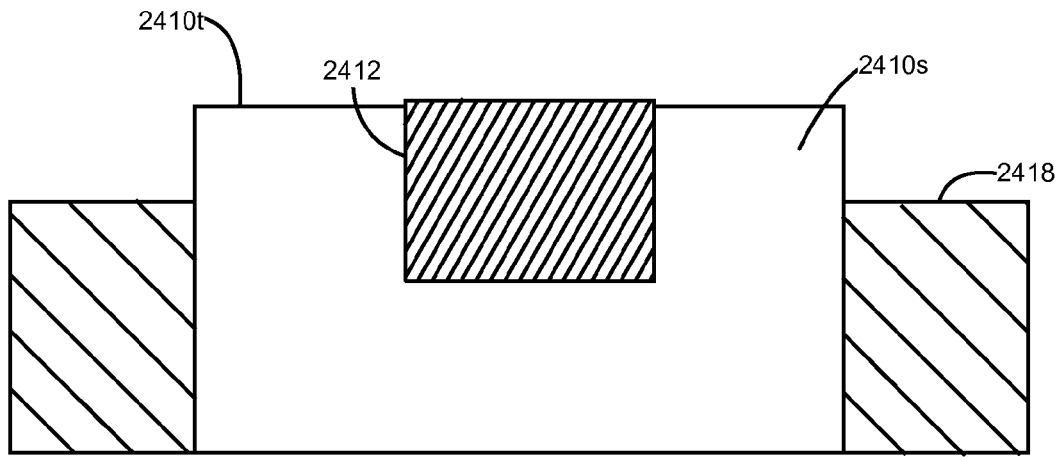
FIG. 34B is a side cutaway view of the Z-directed component and PCB shown in FIG. 32A.

With reference to FIGS. 34A and 34B, manufacturing variations in the thickness of the PCB and the length of the Z-directed component may prevent the Z-directed component from being perfectly flush with both the top and bottom surfaces of the PCB. As a result, in one embodiment, a conductive strip 2412 is formed along a side surface 2410s of a Z-directed component 2410. Conductive strip 2412 runs along side surface 2410s to either the top or bottom surface of Z-directed component 2410. Conductive strip 2412 may be applied after the Z-directed component 2410 is formed. In the example embodiment illustrated, conductive strip 2412 runs along side surface 2410s to a top surface 2410t of Z-directed component 2410. In this manner, conductive strip 2412 forms a bridge between a trace 2414 on the respective top or bottom surface of Z-directed component 2410 and a trace 2416 on a PCB 2418 when the top or bottom surface of the Z-directed component extends past the corresponding top or bottom surface of the PCB. As a result, trace 2414 on Z-directed component 2410 is able to connect to trace 2416 on PCB 2418 even if the top or bottom surface of Z-directed component 2410 is not flush with the corresponding top or bottom surface of PCB 2418. In the example configuration illustrated in FIG. 34B, conductive strip 2412 runs from top surface 2410t of Z-directed component 2410 to a point along side surface 2410s that is below the top surface of the PCB 2418. In one embodiment, conductive strip 2412 extends into the side of Z-directed component 2410 both to decrease its resistance and to ensure that it is not removed if another feature such as a taper is later applied to Z-directed component 2410.

The foregoing description of several embodiments has been presented for purposes of illustration. It is not intended to be exhaustive or to limit the application to the precise forms disclosed, and obviously many modifications and variations are possible in light of the above teaching. It is understood that the invention may be practiced in ways other than as specifically set forth herein without departing from the scope of the invention. It is intended that the scope of the application be defined by the claims appended hereto.

What is claimed is:

1. A Z-directed component for mounting in a mounting hole in a printed circuit board, comprising:
   a body having a top surface, a bottom surface and a side surface, and a cross-sectional shape that is insertable into the mounting hole in the printed circuit board, a first portion of the body being composed of a first dielectric material having a first dielectric constant and a second portion of the body being composed of a second dielectric material having a second dielectric constant that is higher than the first dielectric constant; and
   a conductive channel extending through a portion of the body forming a signal path,
   wherein the body includes a plurality of interleaved conductive plates extending along the length of the body, wherein a first set of the interleaved conductive plates are electrically connected to a reference voltage path and a second set of the interleaved conductive plates are electrically connected to a supply voltage path, the first and second sets of interleaved conductive plates being arranged in an alternating pattern, wherein an outer side portion of the body is composed of the second dielectric material and an inner portion of the body spaced inward from the side surface and substantially surrounded on its sides by the outer side portion of the body composed of the second dielectric material is composed of the first dielectric material, the interleaved conductive plates being positioned in the outer side portion of the body composed of the second dielectric material and the conductive channel extending through the inner portion of the body composed of the first dielectric material along the length of the body from the top surface to the bottom surface.

2. The Z-directed component of claim 1, wherein each of the top surface and the bottom surface includes a conductive trace electrically connected to a respective end of the conductive channel and extending therefrom across the respective top or bottom surface to an edge of the body, the width of each trace being narrower where said trace passes over the outer side portion of the body than where said trace passes over the inner portion of the body.

3. The Z-directed component of claim 1, wherein the top surface and the bottom surface are composed of the first dielectric material and each of the top surface and the bottom surface includes a conductive trace electrically connected to a respective end of the conductive channel and extending therefrom across the respective top or bottom surface to an edge of the body.

4. A printed circuit board, comprising:
   a Z-directed component mounted in a mounting hole in the printed circuit board, the Z-directed component including:
      a body having a top surface, a bottom surface and a side surface, a first portion of the body being composed of a first dielectric material having a first dielectric constant and a second portion of the body being composed of a second dielectric material having a second dielectric constant that is higher than the first dielectric constant; and
      a conductive channel extending through a portion of the body electrically connected to a signal path of the printed circuit board,
      wherein the body of the Z-directed component includes a plurality of interleaved conductive plates extending along the length of the body, wherein a first set of the interleaved conductive plates are electrically connected to a reference voltage path of the printed circuit board and a second set of the interleaved conductive plates are electrically connected to a supply voltage path of the printed circuit board, the first and second sets of interleaved conductive plates being arranged in an alternating pattern, wherein an outer side portion of the body of the Z-directed component is composed of the second dielectric material and an inner portion of the body spaced inward from the side surface and substantially surrounded on its sides by the outer side portion of the body composed of the second dielectric material is composed of the first dielectric material, the interleaved conductive plates being positioned in the outer side portion of the body composed of the second dielectric material and the conductive channel extending through the inner portion of the body composed of the first dielectric material along the length of the body from the top surface to the bottom surface.

5. The printed circuit board of claim 4, wherein each of the top surface and the bottom surface includes a conductive trace electrically connected at one end to a respective end of the conductive channel and electrically connected at the other end to a conductive trace on the respective top or bottom surface of the printed circuit board, the width of each trace on the top and bottom surface of the Z-directed component being narrower where said trace passes over the outer side portion of the body than where said trace passes over the inner portion of the body.

6. The printed circuit board of claim 4, wherein the top surface and the bottom surface of the Z-directed component are composed of the first dielectric material and each of the top surface and the bottom surface includes a conductive trace electrically connected at one end to a respective end of the conductive channel and electrically connected at the other end to a conductive trace on the respective top or bottom surface of the printed circuit board.

7. A Z-directed signal delay line component for mounting in a mounting hole in a printed circuit board, comprising:
   a body having a top surface, a bottom surface and a side surface, and a cross-sectional shape that is insertable into the mounting hole in the printed circuit board, a first portion of the body being composed of a first dielectric material having a first dielectric constant and a second portion of the body being composed of a second dielectric material having a second dielectric constant that is higher than the first dielectric constant; and
   a conductive channel forming a signal path through the body, the conductive channel passing through at least part of the first and second portions of the body,
   wherein the second dielectric material of the second portion of the body imposes a delay on a signal when the signal passes through the conductive channel.

8. A Z-directed component for mounting in a mounting hole in a printed circuit board, comprising:
   a body having a top surface, a bottom surface and a side surface, and a cross-sectional shape that is insertable into the mounting hole in the printed circuit board, a first portion of the body being composed of a first dielectric material having a first dielectric constant and a second portion of the body being composed of a second dielectric material having a second dielectric constant that is higher than the first dielectric constant; and a conductive channel extending through a portion of the body forming a signal path, wherein the body includes a plurality of stacked layers having a conductive material plated on a surface thereof, wherein a first set of the stacked layers are electrically connected to a reference voltage path and a second set of the stacked layers are electrically connected to a voltage supply path, the first and second sets of stacked layers being arranged in an alternating pattern, wherein a first portion of the stacked layers are composed of the first dielectric material and a second portion of the stacked layers are composed of the second dielectric material, wherein the conductive channel extends through an interior portion of the body along the length of the body from the top surface to the bottom surface through the first and second portions of the stacked layers, the width of the conductive channel being narrower where the conductive channel passes through the second portion of the stacked layers composed of the second dielectric material than where the conductive channel passes through the first portion of the stacked layers composed of the first dielectric material.

9. The Z-directed component of claim 8, wherein the top surface and the bottom surface are composed of the first dielectric material and each of the top surface and the bottom surface includes a conductive trace electrically connected to a respective end of the conductive channel and extending therefrom across the respective top or bottom surface to an edge of the body.

10. A Z-directed component for mounting in a mounting hole in a printed circuit board, comprising:

a body having a top surface, a bottom surface and a side surface, and a cross-sectional shape that is insertable into the mounting hole in the printed circuit board, a first portion of the body being composed of a first dielectric material having a first dielectric constant and a second portion of the body being composed of a second dielectric material having a second dielectric constant that is higher than the first dielectric constant; and a conductive channel extending through a portion of the body forming a signal path, wherein the body includes a plurality of stacked layers having a conductive material plated on a surface thereof, wherein a first set of the stacked layers are electrically connected to a reference voltage path and a second set of the stacked layers are electrically connected to a voltage supply path, the first and second sets of stacked layers being arranged in an alternating pattern, wherein a first portion of the stacked layers are composed of the first dielectric material and a second portion of the stacked layers are composed of the second dielectric material, further comprising a second conductive channel electrically connected to the reference voltage path and a third conductive channel electrically connected to the supply voltage path each extending through an interior portion of the body along the length of the body, wherein the conductive channel forming the signal path extends through the interior portion of the body along the length of the body from the top surface to the bottom surface, the second conductive channel electrically connected to the reference voltage path and the third conductive channel electrically connected to the supply voltage path being positioned next to and on opposite sides of the conductive channel forming the signal path, wherein the second conductive channel electrically connected to the reference voltage path and the third conductive channel electrically connected to the supply voltage path are spaced further from the conductive channel forming the signal path where the conductive channel forming the signal path passes through the second portion of the stacked layers composed of the second dielectric material than where the conductive channel forming the signal path passes through the first portion of the stacked layers composed of the first dielectric material.

11. A printed circuit board, comprising:

a Z-directed component mounted in a mounting hole in the printed circuit board, the Z-directed component including:

a body having a top surface, a bottom surface and a side surface, a first portion of the body being composed of a first dielectric material having a first dielectric constant and a second portion of the body being composed of a second dielectric material having a second dielectric constant that is higher than the first dielectric constant; and a conductive channel extending through a portion of the body electrically connected to a signal path of the printed circuit board, wherein the body of the Z-directed component includes a plurality of stacked layers having a conductive material plated on a surface thereof, wherein a first set of the stacked layers are electrically connected to a reference voltage path of the printed circuit board and a second set of the stacked layers are electrically connected to a supply voltage path of the printed circuit board, the first and second sets of stacked layers being arranged in an alternating pattern within the body of the Z-directed component, wherein a first portion of the stacked layers are composed of the first dielectric material and a second portion of the stacked layers are composed of the second dielectric material, wherein the conductive channel extends through an interior portion of the body of the Z-directed component along the length of the body from the top surface to the bottom surface through the first and second portions of the stacked layers, the width of the conductive channel being narrower where the conductive channel passes through the second portion of the stacked layers composed of the second dielectric material than where the conductive channel passes through the first portion of the stacked layers composed of the first dielectric material.

12. The printed circuit board of claim 11, wherein the top surface and the bottom surface of the Z-directed component are composed of the first dielectric material and each of the top surface and the bottom surface includes a conductive trace electrically connected at one end to a respective end of the conductive channel and electrically connected at the other end to a conductive trace on the respective top or bottom surface of the printed circuit board.

13. A printed circuit board, comprising:

a Z-directed component mounted in a mounting hole in the printed circuit board, the Z-directed component including:

a body having a top surface, a bottom surface and a side surface, a first portion of the body being composed of a first dielectric material having a first dielectric constant and a second portion of the body being composed of a second dielectric material having a second dielectric constant that is higher than the first dielectric constant; and a conductive channel extending through a portion of the body electrically connected to a signal path of the printed circuit board, wherein the body of the Z-directed component includes a plurality of stacked layers having a conductive material plated on a surface thereof, wherein a first set of the stacked layers are electrically connected to a reference voltage path of the printed circuit board and a second set of the stacked layers are electrically connected to a supply voltage path of the printed circuit board, the first and second sets of stacked layers being arranged in an alternating pattern within the body of the Z-directed component, wherein a first portion of the stacked layers are composed of the first dielectric material and a second portion of the stacked layers are composed of the second dielectric material, wherein the Z-directed component further includes a second conductive channel electrically connected to the reference voltage path and a third conductive channel electrically connected to the supply voltage path each extending through an interior portion of the body of the Z-directed component along the length of the body, wherein the conductive channel forming the signal path of the Z-directed component extends through the interior portion of the body along the length of the body from the top surface to the bottom surface, the second conductive channel electrically connected to the reference voltage path and the third conductive channel electrically connected to the supply voltage path being positioned next to and on opposite sides of the conductive channel forming the signal path of the Z-directed component, wherein the second conductive channel electrically connected to the reference voltage path and the third conductive channel electrically connected to the supply voltage path are spaced further from the conductive channel forming the signal path of the Z-directed component where said conductive channel passes through the second portion of the stacked layers composed of the second dielectric material than where said conductive channel passes through the first portion of the stacked layers composed of the first dielectric material.

* * * * *